(12) United States Patent
Izumi et al.

(10) Patent No.: US 9,524,901 B2
(45) Date of Patent: Dec. 20, 2016

(54) MULTIHEIGHT ELECTRICALLY CONDUCTIVE VIA CONTACTS FOR A MULTILEVEL INTERCONNECT STRUCTURE

(71) Applicant: SANDISK TECHNOLOGIES INC., Plano, TX (US)

(72) Inventors: Keisuke Izumi, Yokkaichi (JP); Michiaki Sano, Ichinomiya (JP); Hiroshi Sasaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 66 days.

(21) Appl. No.: 14/501,389

(22) Filed: Sep. 30, 2014

(65) Prior Publication Data

US 2016/0093524 A1    Mar. 31, 2016

(51) Int. Cl.
*H01L 21/768*       (2006.01)
*H01L 27/115*       (2006.01)

(52) U.S. Cl.
CPC ..... *H01L 21/76805* (2013.01); *H01L 21/7688* (2013.01); *H01L 27/11575* (2013.01); *H01L 27/11582* (2013.01)

(58) Field of Classification Search
CPC ............... H01L 27/11582; H01L 27/11556; H01L 27/1157; H01L 2924/0002; H01L 27/11578; H01L 2924/00; H01L 21/76897; H01L 21/7682; H01L 21/76831
See application file for complete search history.

(56) References Cited

U.S. PATENT DOCUMENTS

| 2012/0211816 A1 | 8/2012 | Yahashi |
| 2013/0341701 A1 | 12/2013 | Blomme et al. |
| 2015/0011094 A1* | 1/2015 | Narishige et al. ........... H01L 27/11556 438/723 |

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/317,274, filed Jun. 27, 2014, SanDisk Technologies Inc.
U.S. Appl. No. 14/501,441, filed Sep. 30, 2014, SanDisk Technologies Inc.
U.S. Appl. No. 14/501,441, Office Action issued Jan. 4, 2016.

* cited by examiner

*Primary Examiner* — Tony Tran
(74) *Attorney, Agent, or Firm* — The Marbury Law Group PLLC

(57) ABSTRACT

A method of making multi-level contacts includes providing an in-process multilevel device having a device region and a contact region including a stack of alternating sacrificial layers and insulating layers located over a major surface of a substrate. A contact mask having contact mask openings is provided over the stack, and a first over mask having first over mask openings is provided over the contact mask. A subset of the contact mask openings is substantially aligned with the first over mask openings. Contact openings are formed through the stack, wherein each of the contact openings extends substantially perpendicular to the major surface of the substrate to a respective one of the sacrificial layers. A plurality of electrically conductive via contacts is formed in the plurality of the contact openings.

19 Claims, 32 Drawing Sheets

MULTIHEIGHT ELECTRICALLY CONDUCTIVE VIA CONTACTS FOR A MULTILEVEL INTERCONNECT STRUCTURE

FIELD

The present disclosure relates generally to the field of electrically conductive interconnect structures, and specifically to multilevel metal interconnect structures including electrically conductive via contacts having different heights, and methods of manufacturing the same.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. Recently, ultra high density storage devices have been proposed using a three-dimensional (3D) stacked memory structure sometimes referred to as a Bit Cost Scalable (BiCS) architecture. Such ultra high density storage devices include a large number of interconnect wiring levels. For example, a 3D NAND stacked memory device may include at least as many number of wiring levels as the total number of control gate electrodes employed for the 3D NAND stacked memory device.

SUMMARY

According to an aspect of the present disclosure, a method of making multi-level contacts includes providing an in-process multilevel device having a device region and a contact region including a stack of a plurality of alternating sacrificial layers and insulating layers located over a major surface of a substrate. A contact mask with a plurality of contact mask openings is provided over the stack, and a first over mask with a plurality of first over mask openings is provided over the contact mask. A first subset of the plurality of contact mask openings is substantially aligned with the plurality of first over mask openings. A plurality of contact openings is formed, wherein each of the plurality of contact openings extends substantially perpendicular to the major surface of the substrate through the stack to a respective one of the sacrificial layers. A plurality of electrically conductive via contacts is deposited in the plurality of the contact openings.

According to another aspect of the present disclosure, a method of making multi-level contacts, includes providing an in-process multilevel device having a device region and a contact region including a stack of a plurality of alternating sacrificial layers and insulator layers located over a major surface of a substrate. A contact mask with at least one contact mask opening and at least one first terrace mask opening is provided over the stack, wherein the at least one first terrace mask opening is larger than the at least one contact mask opening. At least one first contact opening and at least one first terrace opening are simultaneously formed extending substantially perpendicular to the major surface of the substrate through the stack to a first sacrificial layer by etching a portion of the stack through the at least one contact mask opening and the at least one first terrace mask opening. A first electrically conductive via contact is deposited in the at least one first contact opening.

According to yet another aspect of the present disclosure, a three-dimensional NAND device includes a substrate having a major surface and a stack of plurality of alternating word lines and insulator layers located over the major surface of the substrate and extending substantially parallel to the major surface of the substrate. The plurality of word lines include at least a first word line located in a first device level and a second word line located in a second device level located over the major surface of the substrate and below the first device level. The three-dimensional NAND device further includes a semiconductor channel and at least one charge storage region located adjacent to the semiconductor channel, where at least one end portion of the semiconductor channel extends substantially perpendicular to the major surface of the substrate through the stack. A first plurality of electrically conductive via contacts extend substantially perpendicular to the major surface of the substrate, an insulating liner is located around each of the first plurality of electrically conductive via contacts, and a terraced region in the stack includes end portions of a second set of word lines arranged in a stepped configuration in which underlying word lines extend past overlying word lines in a direction parallel to the major surface of the substrate, and each of the first plurality of electrically conductive via contacts extends through the stack to contact an upper surface of a respective one of the plurality of word lines in a first set of word lines. The insulating liner isolates each of the first plurality of electrically conductive via contacts from all the word lines in the stack through which each electrically conductive via contact extends, except a respective one of the plurality of word lines whose upper surface is contacted by the respective electrically conductive via contact. An insulating layer is located above the terraced region in the stack, and a second plurality of electrically conductive via contacts extends substantially perpendicular to the major surface of the substrate, where each of the second plurality of electrically conductive via contacts extends through the insulating layer to contact an upper surface of a respective one of the second set of word lines.

BRIEF DESCRIPTION OF THE DRAWINGS

FIG. 3A shows a perspective cutaway view of the device shown in FIG. 3. FIG. 16 includes an inset showing a magnified view of a portion of the first exemplary structure.

DETAILED DESCRIPTION

Figure 1:
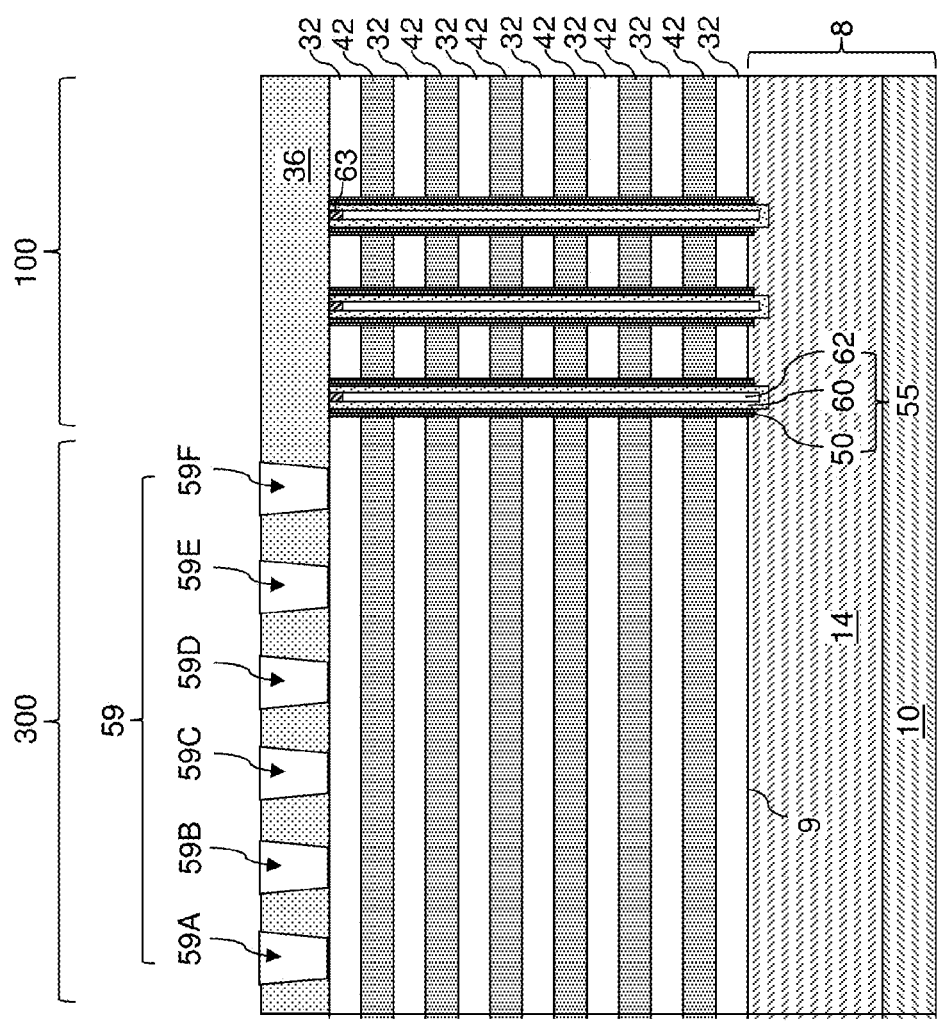
FIGS. 1-17 illustrate sequential vertical cross-sectional views of a first exemplary structure employed to fabricate a device structure containing vertical NAND memory devices and corresponding processing steps according to a first embodiment of the present disclosure.

The present disclosure is directed to multilevel interconnect structures including electrically conductive via contacts having different heights, and methods of manufacturing the same, the various aspects of which are described below. The embodiments of the disclosure can be employed to form various structures including a multilevel interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. The various three dimensional memory devices of the present disclosure include a monolithic three-dimensional NAND string memory device, and can be fabricated employing the various embodiments described herein.

At least some embodiments of the present disclosure provide methods for forming a high density multilevel interconnect structure without significant restrictions on the design of various interconnect components and/or with minimal processing complexity and cost.

According to various embodiments of the present disclosure, contact openings extending to sacrificial layers located at different depths can be formed by providing a contact mask having a plurality of contact mask openings that correspond to the contact openings, and providing a series of over masks to sequentially expose subsets of the contact mask openings.

In various embodiments, the contact mask provides accuracy in location and cross-sectional dimension of the contact openings, while a first over mask selects a subset of the contact mask openings to etch in a particular anisotropic etch step. Thus, the mask openings of the first over mask do not need to be as accurate in cross-sectional dimension as the mask openings of the contact mask. In some embodiments, the mask openings of the first over mask are larger than the mask openings of the contact mask. In various embodiments, the contact mask is a hard mask, and the first over mask is a photoresist.

In one embodiment, pairs of electrically conductive via contacts and electrically conductive electrodes can be simultaneously formed as integrated line and via structures. In another embodiment, electrically conductive electrodes can be formed by replacement of portions of the sacrificial layers, and the electrically conductive via contacts can be subsequently formed on the electrically conductive electrodes. An interconnect structure can be provided in which electrically conductive via contacts extending to electrically conductive electrodes located at different levels are provided with self-aligned insulating liner to provide electrical isolation from all other electrically conductive electrodes except one to which a respective electrically conductive via contact is electrically shorted.

Referring to FIG. 1, a first exemplary structure is illustrated, which can be employed, for example, to fabricate a device structure containing vertical NAND memory devices according to a first embodiment of the present disclosure. The first exemplary structure includes a substrate 8, which can be a semiconductor substrate. Various semiconductor devices can be formed on, or over, the substrate 8 employing methods known in the art. For example, an array of memory devices can be formed in a device region 100. Electrically conductive via contacts to the electrically conductive electrodes of the devices in the device region 100 can be subsequently formed in a contact region 300.

The substrate 8 can include a substrate semiconductor layer 10. The substrate semiconductor layer 10 may be a semiconductor material layer formed over an underlying substrate 8 or it may be an upper portion of a semiconductor substrate 8. The substrate semiconductor layer 10 can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-5}$ Ohm-cm to $1.0 \times 10^5$ Ohm-cm, and is capable of producing a doped material having electrical conductivity in a range from 1 Ohm-cm to $1.0 \times 10^5$ Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than 1.0 Ohm-cm. As used herein, an "insulator material" or a "dielectric material" refers to a material having electrical conductivity less than $1.0 \times 10^{-5}$ Ohm-cm. All measurements for electrical conductivities are made at the standard condition.

Optionally, at least one doped well 14 (e.g., p-type well) can be formed within the substrate semiconductor layer 10, such as a single crystalline silicon surface. In one embodiment, the substrate 8 can comprise a silicon substrate, and the vertical NAND device can comprise a monolithic, three-dimensional array of NAND strings that includes a monolithic three-dimensional NAND string located over the silicon substrate. For example, at least one memory cell that is located in a first device level of the three-dimensional array of NAND strings can be located over another memory cell in a second device level of the three-dimensional array of NAND strings. The silicon substrate can contain an integrated circuit comprising a driver circuit for the at least one memory cell.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application No. 14/133,979, filed on Dec. 19, 2013, U.S. patent application No. 14/225,116, filed on Mar. 25, 2014, and/or U.S. patent application No. 14/225,176, filed on Mar. 25, 2014, all of which are incorporated herein by reference. While the present disclosure is described employing an embodiment in which a source region 12 is formed in a region laterally offset from a vertical portion of each channel and memory structure 55, and a horizontal portion of the substrate semiconductor layer 10 or the at least one doped well 14 that contacts the vertical portion of the channel and memory structure 55 can function as a horizontal portion of the channel, embodiments are expressly contemplated herein in which a first electrode or source region 12 is formed directly underneath channel and memory structures 55 of memory cells, as described in U.S. patent application No. 14/317,274, filed on Jun. 27, 2014, which is incorporated herein by reference. A select transistor can be formed between the top of the substrate semiconductor layer 10 and the bottommost control gate of the memory devices.

A stack of alternating layers of a first material and a second material different from the first material is formed over the major 9 surface of the substrate 8. The major surface of the substrate 8 can optionally include the top surface of a source electrode or source 12 and/or a surface of a body region of a field effect transistor. In one embodiment, the stack can include an alternating plurality of insulator layers 32 and sacrificial layers 42. As used herein, an "an alternating plurality" of first elements and second elements refers to a structure in which an instance of the first elements and an instance of the second elements form a unit that is repeated within a stacked structure. The first elements may have the same thickness, or may have different thicknesses. The second elements may have the same thickness, or may have different thicknesses.

The stack of the alternating layers is herein referred to as an alternating stack (32, 42). In one embodiment, the alternating stack (32, 42) can include insulator layers 32 composed of the first material, and sacrificial layers 42 composed of a second material different from that of insulator layers 32. The sacrificial layers 42 may comprise an electrically insulating material, a semiconductor material, or a conductive material. The second material of the sacrificial layers 42 can be subsequently replaced with electrically conductive electrodes which can function, for example, as control gate electrodes of a vertical NAND device.

The first material of the insulator layers 32 can be at least one electrically insulating material. As such, each insulator layer 32 can be an insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The second material of the sacrificial layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. Non-limiting examples of the second material include silicon nitride, an amorphous semiconductor material (such as amorphous silicon), and a polycrystalline semiconductor material (such as polysilicon).

In one embodiment, the insulator layers 32 can include silicon oxide, and sacrificial layers 42 can include silicon nitride sacrificial layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial layers 42 can be formed, for example, CVD or atomic layer deposition (ALD).

The sacrificial layers 42 can be suitably patterned so that conductive material portions to be subsequently formed by replacement of the sacrificial layers 42 can function as electrically conductive electrodes, such as the control gate electrodes of the monolithic three-dimensional NAND string memory devices to be subsequently formed. The sacrificial layers 42 may comprise a portion having a planar shape extending substantially parallel to the major surface 9 of the substrate 8.

In some embodiments, the thicknesses of the insulator layers 32 and the sacrificial layers 42 can be in a range from 20 nm to 50 nm, although lesser and greater thicknesses can be employed for each insulator layer 32 and for each sacrificial layer 42. The number of repetitions of the pairs of an insulator layer 32 and a sacrificial layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial layer 42 in the alternating stack (32, 42) can have a uniform thickness that is substantially invariant within each respective sacrificial layer 42.

A lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings. In other words, the transfer of the pattern in the patterned lithographic material stack through the alternating stack (32, 42) forms the memory opening through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, a sacrificial etch stop layer (not shown) may be employed between the alternating stack (32, 42) and the substrate 8. The sidewalls of the memory openings can be substantially vertical, or can be tapered. The patterned lithographic material stack can be subsequently removed, for example, by ashing.

Any remaining portion of the bottommost first material layer 32 underneath each memory opening is subsequently etched so that the memory openings extend from the top surface of the alternating stack (32, 42) to the substrate semiconductor layer 10.

As used herein, a first element "overlies" a second element if a first horizontal plane including the bottommost point of the first element is within, or above, a second horizontal plane including a topmost point of the second element and if there exits an areal overlap between the area of the first element and the area of the second element in a see-through view along a direction perpendicular to the first and second horizontal planes. If a first element overlies a second element, the second element "underlies" the first element.

Each of the memory openings can include a sidewall (or a plurality of sidewalls) that extends substantially perpendicular to the major surface of the substrate 8 and is defined by the physically exposed sidewall surfaces of the alternating stack (32, 42,). Each of the memory openings can further include a bottom surface that corresponds to the major (i.e., top) surface 9 of the substrate 8 or that is located above or below the major surface of the substrate 8.

A channel and memory structure 55 can be formed within each memory opening through the alternating stack (32, 42). The channel and memory structures 55 can be formed, for example, by depositing a memory film layer in the memory openings and over the alternating stack (32, 42), and by anisotropically etching the memory film layer. The memory film layer can be a stack of contiguous material layers that overlie the entirety of the alternating stack (31, 42). The memory film layer contacts all sidewall surface(s) and all bottom surface(s) of the memory openings. The memory film layer is a contiguous film stack that provides the functionality of charge storage in the absence of an external electrical bias voltage, while enabling charge transfer in the presence of a suitable external electrical bias voltage.

In one embodiment, the memory film layer can be a stack, in the order of formation, of a blocking dielectric layer, a charge storage layer, and a tunnel dielectric layer. In one embodiment, a plurality of floating gates or a charge storage dielectric can be located between the tunneling dielectric layer and the blocking dielectric layer.

The blocking dielectric layer contacts the sidewalls of the memory openings. Specifically, the blocking dielectric layer can contact the sidewalls of the sacrificial layers 42. The blocking dielectric layer may include one or more dielectric material layers that can function as the dielectric material(s) of a control gate dielectric between the sacrificial layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial layers 42 prior to forming the metal control gate electrodes through the backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer. The memory film layer (and any additional layer such as a permanent channel material layer or a sacrificial layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50.

A semiconductor channel 60 can be formed on inner sidewalls of each memory film 50 by deposition of a semiconductor material layer and a subsequent anisotropic etch of the semiconductor material layer. The semiconductor material layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack (32, 42). The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening. A memory film 50, a semiconductor channel 60, and a dielectric core 62 within a same memory opening constitutes a channel and memory structure 55.

Drain regions 63 can be formed by recessing a top portion of each dielectric core 62 and depositing a doped semiconductor material. The doped semiconductor material can be, for example, doped polysilicon. Excess portions of the deposited semiconductor material can be removed from above the top surface of the alternating stack (32, 42), for example, by chemical mechanical polishing (CMP) or a recess etch.

As shown in FIG. 1, a contact mask 36 can be formed over the alternating stack (32, 42), the channel and memory structures 55 and the drain regions 63. The contact mask 36 functions as a mask during a subsequent etch process. In some embodiments, the contact mask 36 is a hard mask layer. The contact mask 36 can be a dielectric material layer including a material that is different from the material of the sacrificial layers 42. The contact mask 36 can include a dielectric material such as silicon oxide or an insulating metal oxide (such as $Al_2O_3$, $HfO_2$, $Ta_2O_5$, etc.). The contact mask 36 can be deposited, for example, by chemical vapor deposition. The thickness of the contact mask 36 can be in a range from 30 nm to 1,000 nm, although lesser and greater thicknesses can also be employed.

As shown in FIG. 1, contact mask 36 includes a plurality of contact mask openings 59. The plurality of openings in the contact mask 36 can be formed in areas in which formation of contact openings is desired. As used herein, a contact opening refers to a cavity having sidewalls that extend from, and adjoin, a top surface of a structure and extend to a depth within the structure. The bottom of a contact opening may have a surface vertically recessed from the top surface of the structure, or can have an opening that is connected to another cavity underlying the contact opening. A contact opening as initially formed may be a cavity having an opening, and can be subsequently filled with at least one material portion.

The locations of the contact mask openings 59 in the contact mask 36 can be selected to include areas of the electrically conductive via contacts to be subsequently formed and to extend to different levels of the alternating stack (32, 42). As used herein, a "level" of a structure including alternating layers is defined as the relative position of a unit of repetition, which is a pair of a first material layer and a second material layer, within the structure. Each adjoining pair of a first material layer and a second material layer within a structure containing the alternating layers can be assigned an integer selected from a set of positive integers such that the assigned integer increases by 1, or decreases by one, as one counts each pair of the first and second material layers from one end of the structure to the opposite end of the structure. Each integer corresponds to a level (e.g., level 1) within the structure.

Figure 1A:
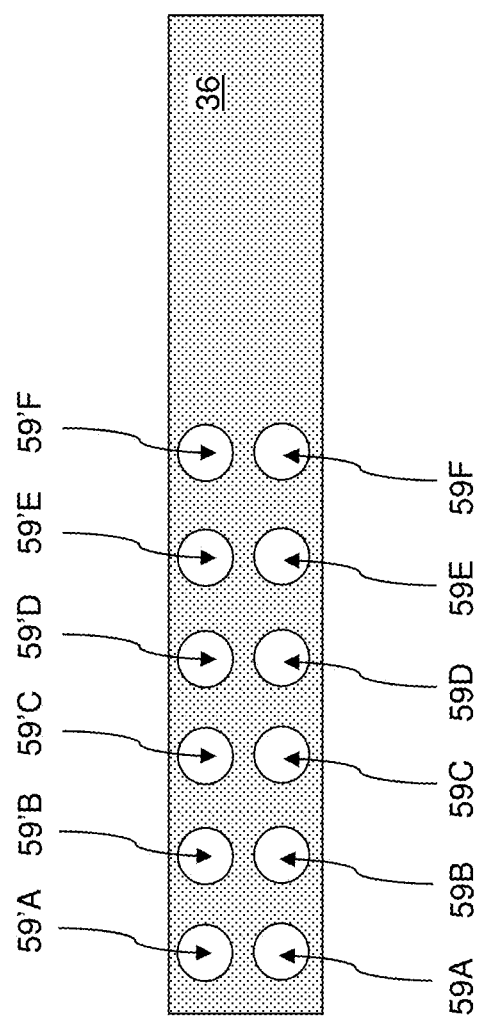
FIG. 1A shows a plan view of the device shown in FIG. 1.

In some embodiments, the contact mask openings 59 in the contact mask 36 are formed by an etch, which can be an anisotropic etch that employs a patterned photoresist layer as an etch mask. For example, the anisotropic etch can be a reactive ion etch. Upon transfer of the pattern in the photoresist layer through the contact mask 36, a plurality of contact mask openings 59 is formed within the contact mask 36. The plurality of openings can form a two dimensional array of openings that extend along two different horizontal directions, as shown in FIG. 1A.

Figures 2, 2A:
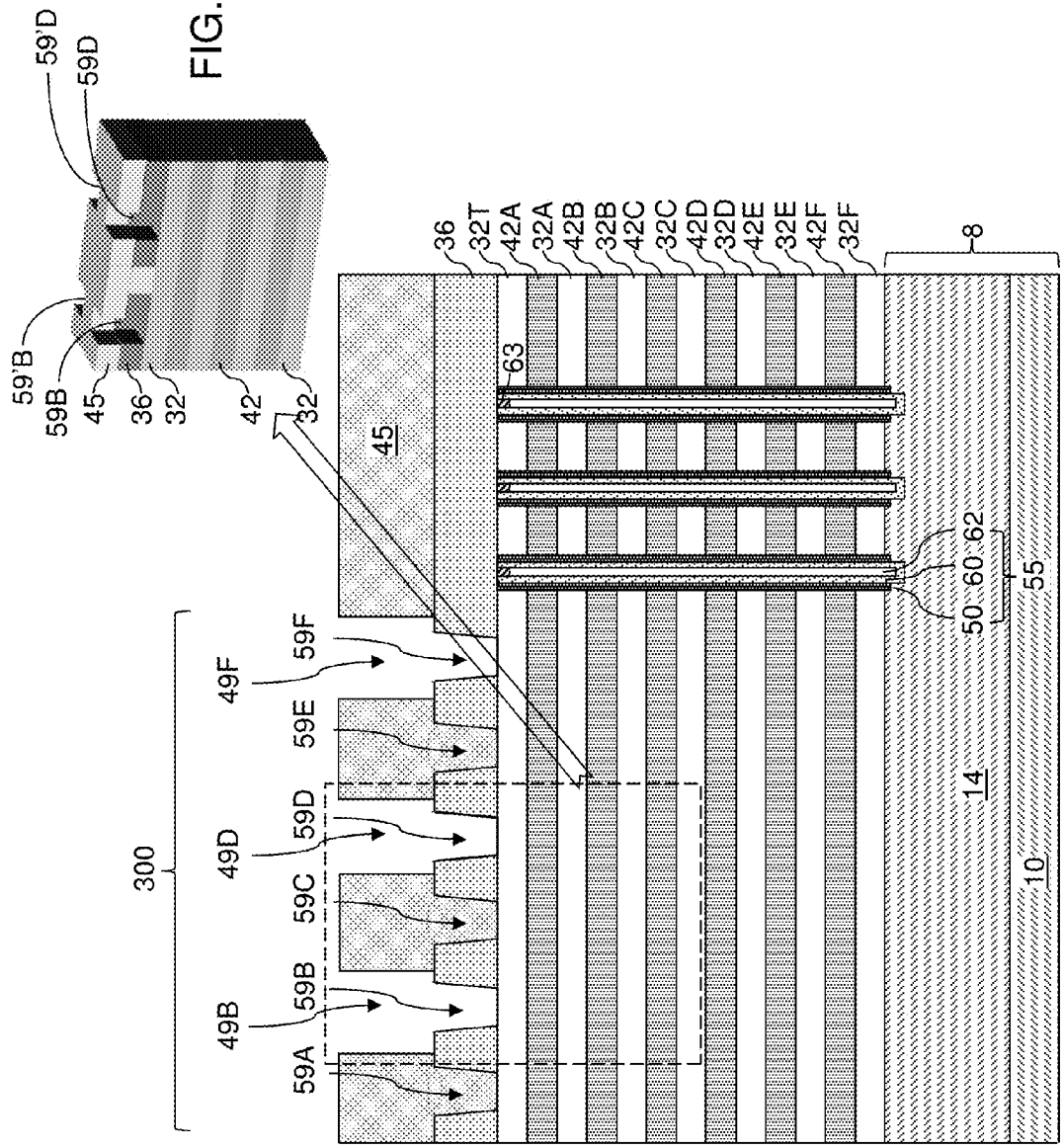
FIG. 2A shows a perspective cutaway view of the device shown in FIG. 2.

For the purpose of facilitating description of the various embodiments of the present disclosure, the different levels of the material layers of the present disclosure are assigned different level names. The topmost layer among the insulator layers 32 is herein referred to as a topmost insulator layer 32T, as shown in FIG. 2. In an alternating stack (32, 42) including a total of N sacrificial layers, the sacrificial layer 42 contacting the bottom surface of the topmost insulator layer 32T is herein referred to as a first-from-top sacrificial layer 42A or an N-th-from-bottom sacrificial layer. The insulator layer 32 contacting the bottom surface of the first-from-top sacrificial layer 42A (which is the N-th-from-bottom sacrificial layer) is herein referred to as a first-from-top insulator layer 32A. The first-from-top sacrificial layer 42A and the first-from-top insulator layer 32A collectively constitute a first-from-top level or an N-th-from-bottom level. For every integer i that is greater than 1 and not greater than the total number N of the sacrificial layers 42 in the alternating stack (32, 42), the sacrificial layer 42 contacting the bottom surface of the (i−1)-th insulator layer is herein referred to as the i-th-from-top sacrificial layer or the (N+1−i)-th-from-bottom sacrificial layer. Similarly, for every integer i that is greater than 1 and not greater than the total number of the sacrificial layers 42 in the alternating stack (32, 42), the insulator layer 32 contacting the bottom surface of the i-th sacrificial layer is herein referred to as the i-th-from-top insulator layer or the (N+1−i)-th-from-bottom insulator layer. If a total of N sacrificial layers 42 exist in the alternating stack (32, 42), the N-th insulator layer is the insulator layer that is the most proximal to the substrate 8 among the insulator layers 32 in the alternating stack (32, 42).

Thus, the alternating stack (32, 42) includes, from top to bottom, a topmost insulator layer 32T, a first-from-top sacrificial layer 42A, a first-from-top insulator layer 32A, a second-from-top sacrificial layer 42B, a second-from-top insulator layer 32B, an alternating stack including at least one intermediate sacrificial layer 42C and at least one intermediate insulator layer 32C, an (N−2)-th-from-top sacrificial layer 42D, an (N−2)-th-from-top insulator layer 32D, an (N−1)-th-from-top sacrificial layer 42E, an (N−2)-th-from-top insulator layer 32E, an N-th-from-top sacrificial layer 42F, and an N-th-from-top insulator layer 32F. It is understood that an insulator layer 32 can refer to any of, or each of, the various insulator layers (32A, 32B, 32C, 32D, 32E, 32F), and a sacrificial layer 42 can refer to any of, or each of, the various sacrificial layers (42A, 42B, 42C, 42D, 42E, 42F). Further, insulator layers 32 can refer to any plurality of, or all of, the various insulator layers (32A, 32B, 32C, 32D, 32E, 32F), and sacrificial layers 42 can refer to any plurality of, or all of, the various sacrificial layers (42A, 42B, 42C, 42D, 42E, 42F).

The plurality of contact mask openings 59 in the contact mask 36 can include a contact mask opening 59A that is formed in each area in which it is desired to form a contact opening that extends to the N-th-from-top sacrificial layer 42F upon full formation, i.e., at the end of processing steps that completes formation of the contact opening. The N-th-from-top sacrificial layer 42F is the sacrificial layer 42 that is most proximal to the substrate 8 and most distal from the top surface of the alternating stack (32, 42). The plurality of contact mask openings 59 in the mask layer 36 can further include at least one second contact mask opening 59B that is formed in each area in which it is desired to form a contact opening that extends to the (N−1)-th-from-top sacrificial layer 42E upon full formation. The plurality of contact mask openings 59 in the mask layer 36 can further include at least one third contact mask opening 59C that is formed in each area in which it is desired to form a contact opening that extends to the (N−2)-th-from-top sacrificial layer 42D upon full formation. The plurality of contact mask openings 59 in the mask layer 36 can further include at least one intermediate-level contact mask opening 59D that formed in each area in which it is desired to form a contact opening that extends to a sacrificial layer 42 located between the (N−2)-th-from-top sacrificial layer 42D and the second-from-top sacrificial layer 42B upon full formation. The plurality of contact mask openings 59 in the mask layer 36 can further include at least one (N−1)-th contact mask opening 59E that formed in each area in which it is desired to form a contact opening that extends to the second-from-top sacrificial layer 42B upon full formation. The plurality of contact mask openings 59 in the mask layer 36 can further include at least N-th contact mask opening 59F that formed in each area in which it is desired to form a contact opening that extends to the first-from-top sacrificial layer 42A upon full formation.

In one embodiment, the plurality of contact mask openings 59 can be arranged as a linear array such that each contact mask opening in the contact mask 36 that corresponds to a contact opening to extend to a deeper depth upon full formation is located to a predetermined side of the linear array with respect to any contact mask opening in the contact mask that corresponds to a contact opening to extend to a shallower depth upon full formation. In one embodiment, the plurality of contact mask openings 59 can be periodic along one direction such that the pitch between each neighboring pair of contact mask openings 59 is the same. In one embodiment, the pitch between each neighboring pair of contact mask openings 59 can increase along one direction with the increase in the target depth of the corresponding contact openings in order to prevent electrical shorts due to lateral broadening of contact openings with depth.

In some embodiments, the contact opening does not comprise a terrace opening. In these embodiments, the pitch between each neighboring pair of contact openings is smaller than the pitch for analogous devices having terrace openings.

Referring to FIG. 2, a first over mask 45 is formed over the contact mask 36. In various embodiments, the first over mask 45 comprises, for example, a photoresist layer, an organic material layer, a dielectric material layer, or a semiconductor material layer.

In one embodiment, the first over mask 45 can be a photoresist layer. In another embodiment, the first over mask 45 can be an organic material layer including an organic material that can be patterned, for example, by a wet etch employing a solvent. In yet another embodiment, the first over mask 45 can be a dielectric material layer that includes a dielectric material that is different from the materials of the contact mask 36 and the insulator layers 32 and can be uniformly etched or recessed by a wet etch or a dry etch. In still another embodiment, the first over mask 45 can be a semiconductor material layer that includes a semiconductor material that can be uniformly etched or recessed by a wet etch or a dry etch. The thickness of the first over mask 45 can be in a range from 1 micron to 10 microns, although lesser and greater thicknesses can also be employed. In one embodiment, the first over mask 45 can be a photoresist layer having a thickness in a range from 2 microns to 5 microns.

The first over mask 45 can be patterned with a plurality of first over mask openings 49 to physically expose a first subset of the contact mask openings 59. In the embodiment shown in FIGS. 2 and 2A, first over mask openings 49B, 49D, and 49F are substantially aligned with and expose contact mask openings 59B, 59D, and 59F, while contact mask openings 59A, 59C, and 59E are covered by a remaining portion of the first over mask 45. If the first over mask 45 is a photoresist layer, then the first over mask 45 can be lithographically patterned, i.e., by a combination of lithographic exposure and development. If the first over mask 45 is not a photoresist layer, the first over mask 45 can be patterned by application of a photoresist layer thereupon, lithographic patterning of the photoresist layer, and etching of the portions of the first over mask 45 that are not covered by the remaining portion of the photoresist layer, for example, by an anisotropic etch. The photoresist layer may be removed after patterning the first over mask 45. A remaining portion of the first over mask 45 fills contact mask openings 59A, 59C, and 59E in the contact mask 36 except the contact mask openings 59B, 59D, and 59F.

The location and cross-sectional dimensions of each contact opening are determined by the location and cross sectional dimensions of the contact mask openings 59. Thus, the cross-sectional dimensions of the first over mask openings 49 may be the same dimensions, or have larger dimensions, than the cross-sectional dimensions of each contact opening. In some embodiments, each first over mask opening 49 is larger than the corresponding contact mask opening 59.

Figure 3:
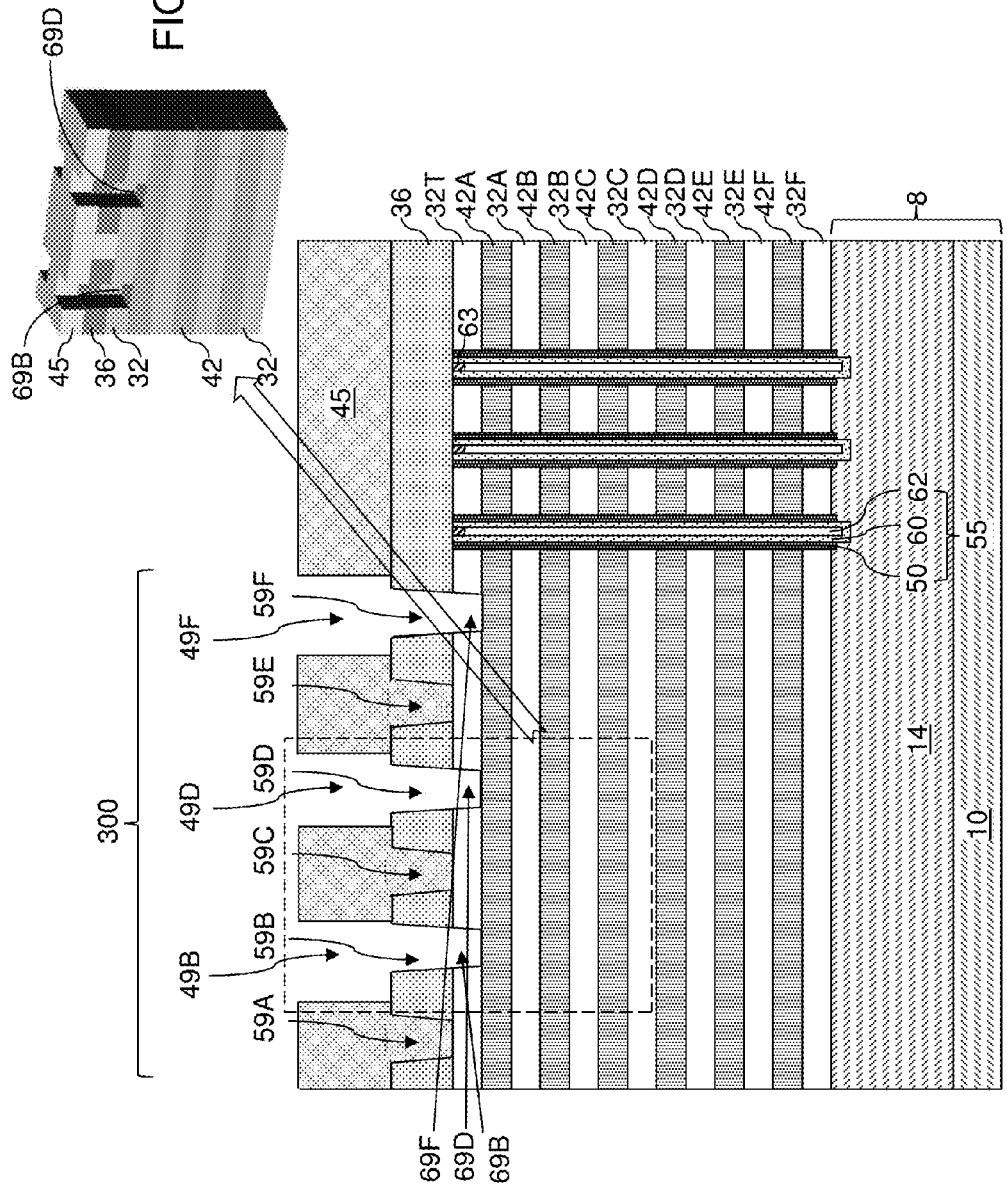

Each portion of the topmost insulator layer 32T underlying the contact mask openings 59B, 59D, and 59F is anisotropically etched employing the combination of the contact mask 36 and the first over mask 45 as an etch mask to form a plurality of contact openings 69, as shown in FIGS. 3 and 3A. Contact openings 69B, 69D, and 69F are formed through the contact mask 36 and the topmost insulator layer 32T within each area of the corresponding contact mask opening 59B, 59D, and 59F in the contact mask 36. In some embodiments, contact openings 69 extend substantially perpendicular to the major surface of the substrate. In one embodiment, the chemistry of the anisotropic etch can be selected such that the bottom surface of each contact opening 69B, 69D, and 69F is formed at the top surface of, or between the top surface and the bottom surface of, or at the bottom surface of topmost insulator layer 32T at the end of the processing step shown in FIGS. 3 and 3A. In one embodiment, the chemistry of the anisotropic etch can be selective to the second material, i.e., the material of the sacrificial layers 42. In this case, the bottom surface of each contact opening 69B, 69D, and 69F can be formed at the top surface of the first-from-top sacrificial layer 42A, as shown in FIGS. 3 and 3A. Alternately, the anisotropic etch process can include multiple steps so that portions of the topmost insulator layer 32T and the first-from-top sacrificial layer 42A underlying each contact mask opening 59B, 59D, and 59F can be etched by the anisotropic etch. In this case, the bottom surface of each contact opening 69B, 69D, and 69F can be formed at the top surface of the first-from-top insulator layer 32A, which is coplanar with the bottom surface of the first-from-top sacrificial layer 42A.

Figure 4:
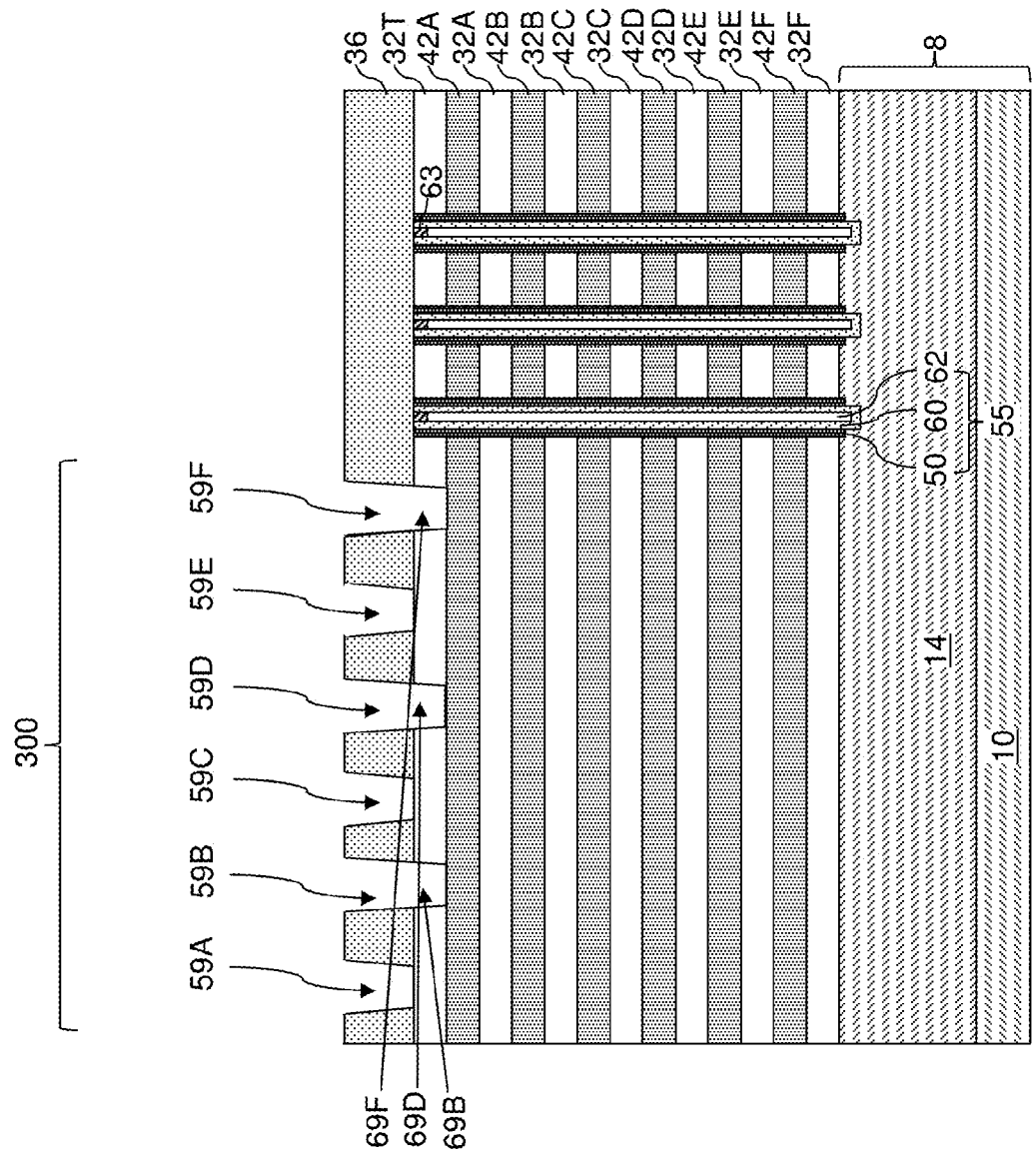

As shown in FIG. 4, the first over mask 45 is then removed. In some embodiments, the first over mask 45 is photoresist, and can be removed, for example, by ashing.

Figure 5:
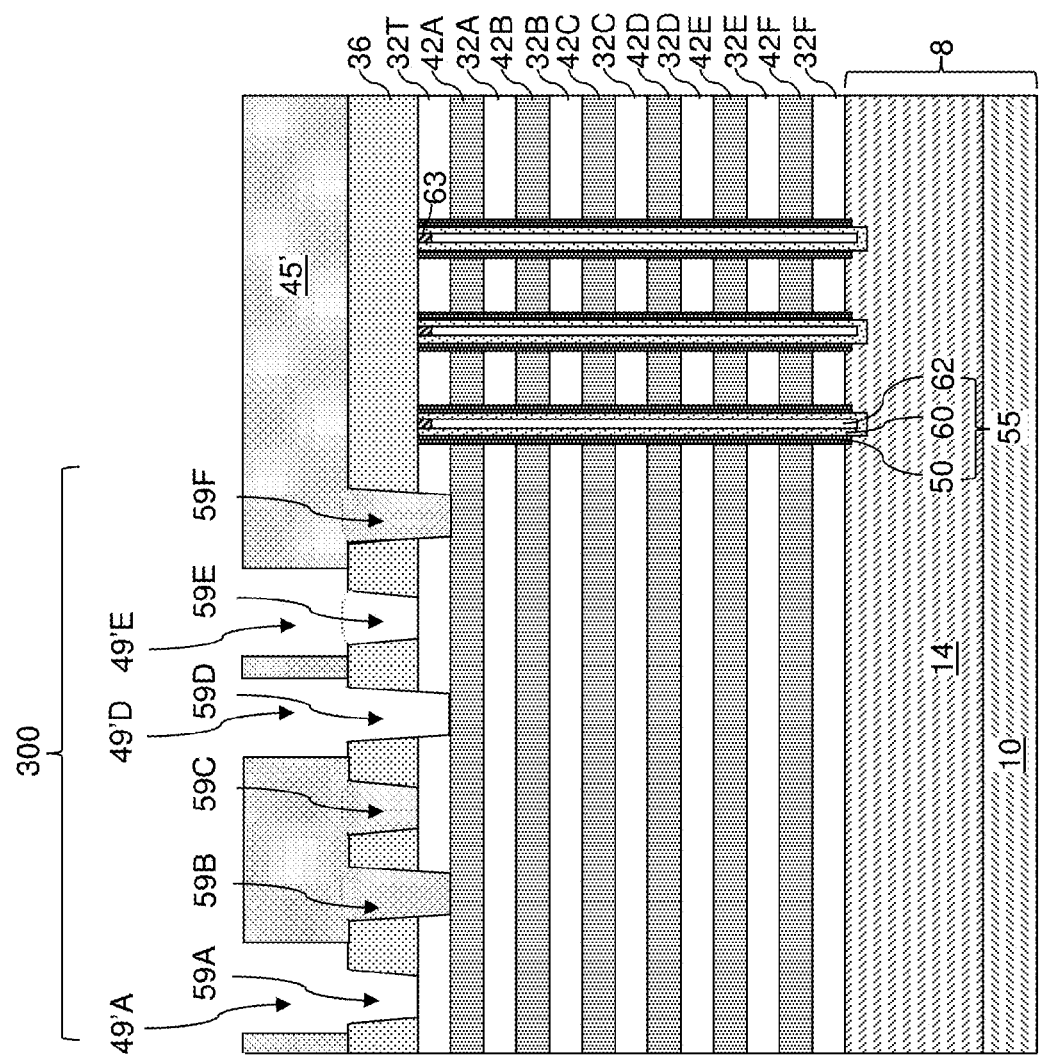

Referring to FIG. 5, a second over mask 45' is formed over the contact mask 36. In various embodiments, the second over mask 45' comprises, for example, a photoresist layer, an organic material layer, a dielectric material layer, or a semiconductor material layer. In some embodiments, the second over mask 45' comprises the same material as the first over mask 45.

The thickness of the second over mask 45' can be in a range from 1 micron to 10 microns, although lesser and greater thicknesses can also be employed. In one embodiment, the second over mask 45' has approximately the same thickness as the first over mask 45.

Similar to the first over mask 45, the second over mask 45' can be patterned with a plurality of second over mask openings 49' to physically expose a second subset of the contact mask openings 59 that is different from the first subset exposed by the first over mask 45. In the embodiment shown in FIG. 5, second over mask openings 49'A, 49'D, and 49'E are substantially aligned with and expose contact mask openings 59A, 59D, and 59E, while contact mask openings 59B, 59C, and 59F are covered by a remaining portion of the second over mask 45'. The second over mask 45' may be patterned by any method, for example a method described above with respect to the first over mask 45. A remaining portion of the second over mask 45' fills contact mask openings 59B, 59C, and 59F in the contact mask 36 except the contact mask openings 59A, 59D, and 59E.

The location and cross-sectional dimensions of each contact opening are determined by the location and cross sectional dimensions of the contact mask openings 59. Thus, the cross-sectional dimensions of the second over mask openings 49' may be the same dimensions, or have larger dimensions, than the cross-sectional dimensions of each contact opening. In some embodiments, each second over mask opening 49' is larger than the corresponding contact mask opening 59.

Figure 6:
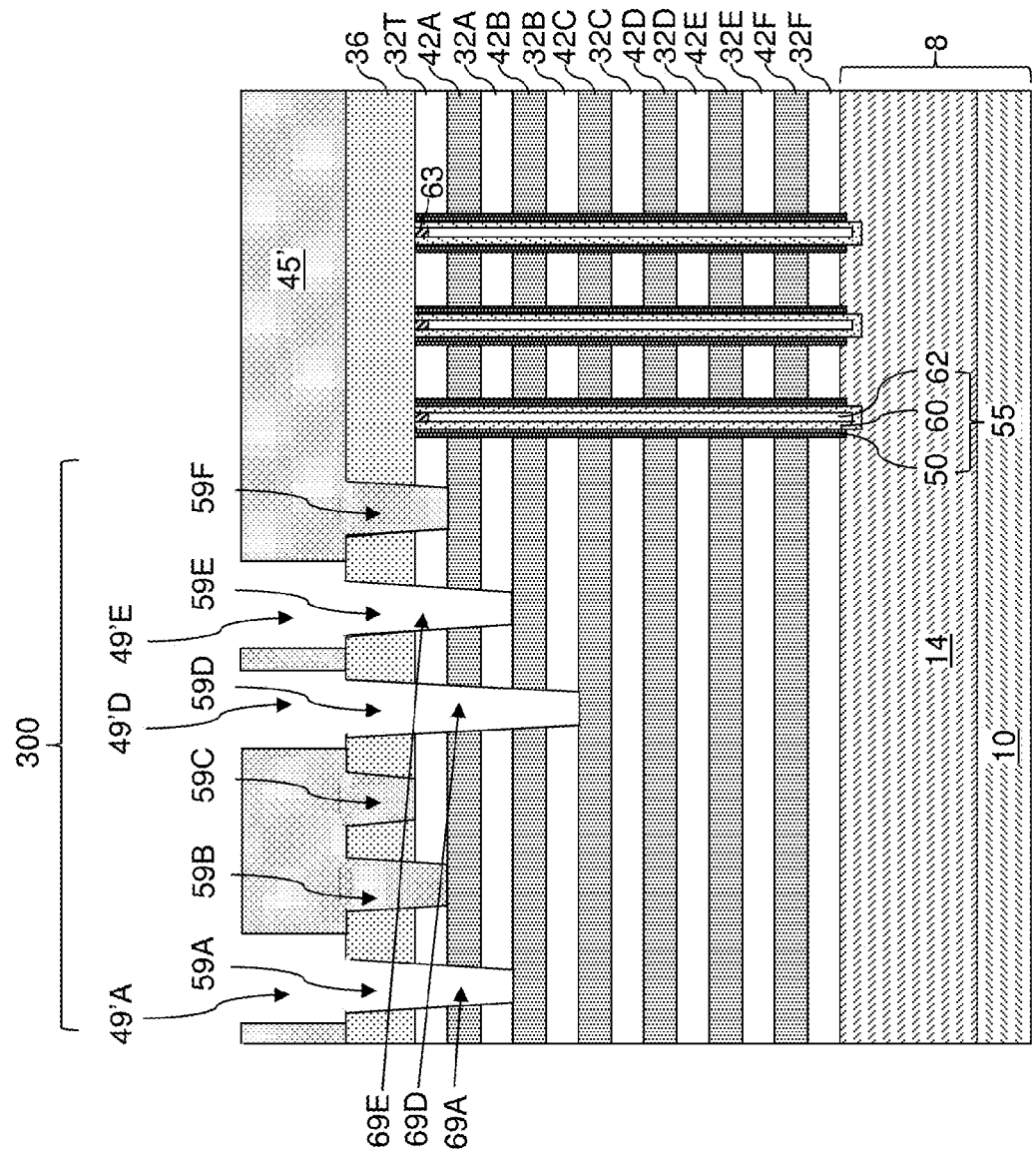

A portion of the stack (32,42) underlying the contact mask openings 59A, 59D, and 59E is anisotropically etched employing the combination of the contact mask 36 and the second over mask 45'. As shown in FIG. 6, an anisotropic etch process is performed to vertically extend the contact opening 69D downward through a pair of the sacrificial layer 42A and the insulator layer 32A. If the bottom surface of each first contact opening 69D is located at the top surface of the first-from-top sacrificial layer 42A at the end of the processing steps of FIG. 4, the bottom surface of each first contact opening 69D is recessed through the first-from-top sacrificial layer 42A during a first step of the anisotropic etch, and then further recessed through the first-from-top insulator layer 32A during a second step of the anisotropic etch. During the second step, contact openings 69A and 69E can be formed through the physically exposed openings in the contact mask 36 and the topmost insulator layer 32T concurrently with the recessing of the contact opening 69D through the insulator layer 32A. Each contact opening 69A and 69E can be formed within an area of contact mask openings 59A and 59E, respectively, within the contact mask 36.

If the bottom surface of each first contact opening 69D is located at the top surface of the insulator layer 32A at the end of the processing steps of FIG. 4, the bottom surface of each first contact opening 69D is recessed through the insulator layer 32A during a first step of the anisotropic etch, and then further recessed through the second-from-top sacrificial layer 42B during a second step of the anisotropic etch. During the first step, contact openings 69A and 69E can be formed through the contact mask 36 and the topmost insulator layer 32T concurrently with the recessing of the contact opening 69D through the insulator layer 32A. During the second step, the contact openings 69A and 69E can be recessed through the first-from-top sacrificial layer 42A concurrently with the recessing of the contact opening 69D through the sacrificial layer 42B. Each contact opening 69A and 69E can be formed within an area of contact mask openings 59A and 59E, respectively, within the contact mask 36.

In some embodiments, the first and second steps of the anisotropic etch are repeated, thus deepening contact openings 69A, 69D, and 69E by the thickness of another pair of sacrificial layer 42 and insulator layer 32.

Figure 7:
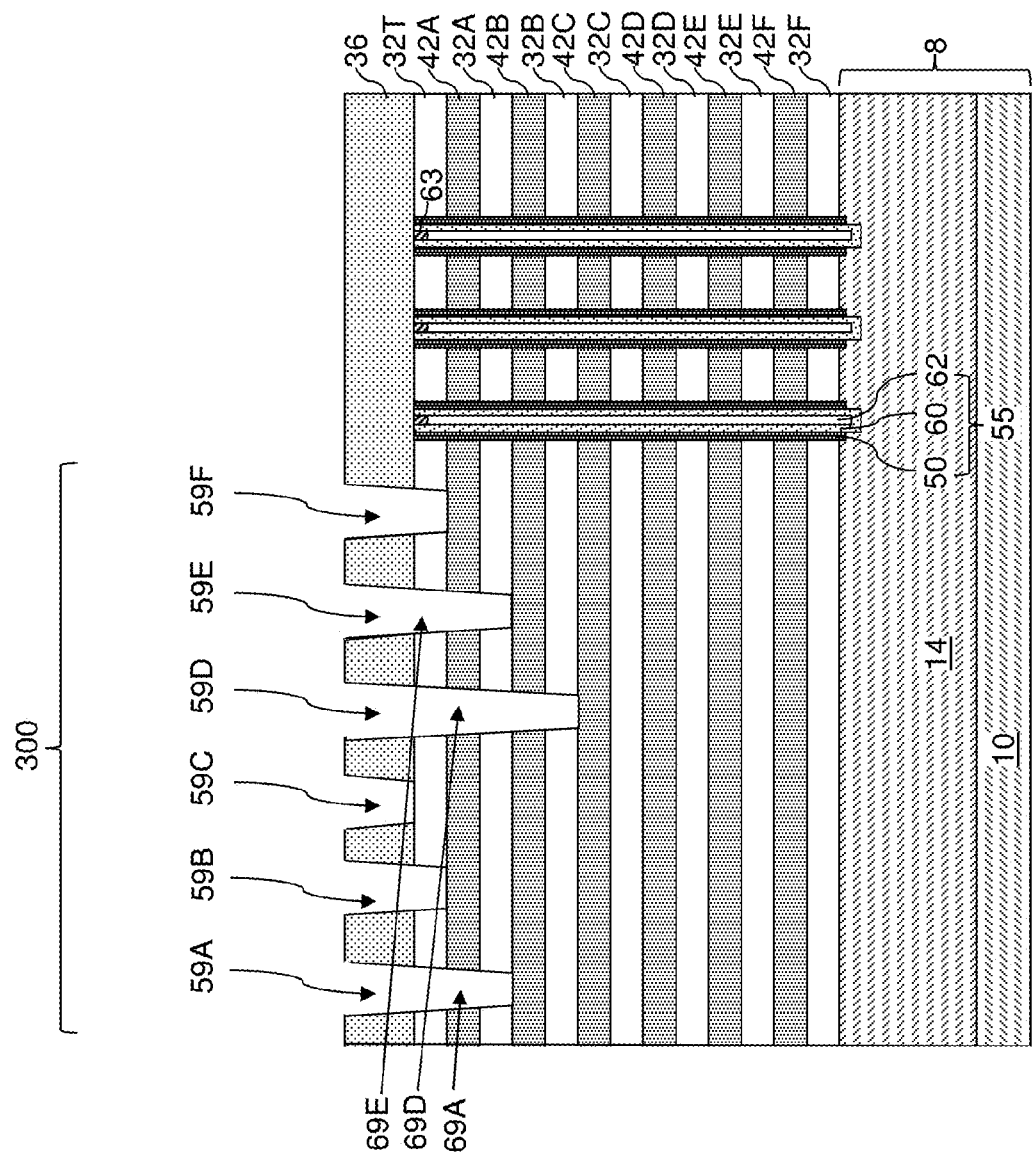

As shown in FIG. 7, the second over mask 45' is then removed.

Figure 8:
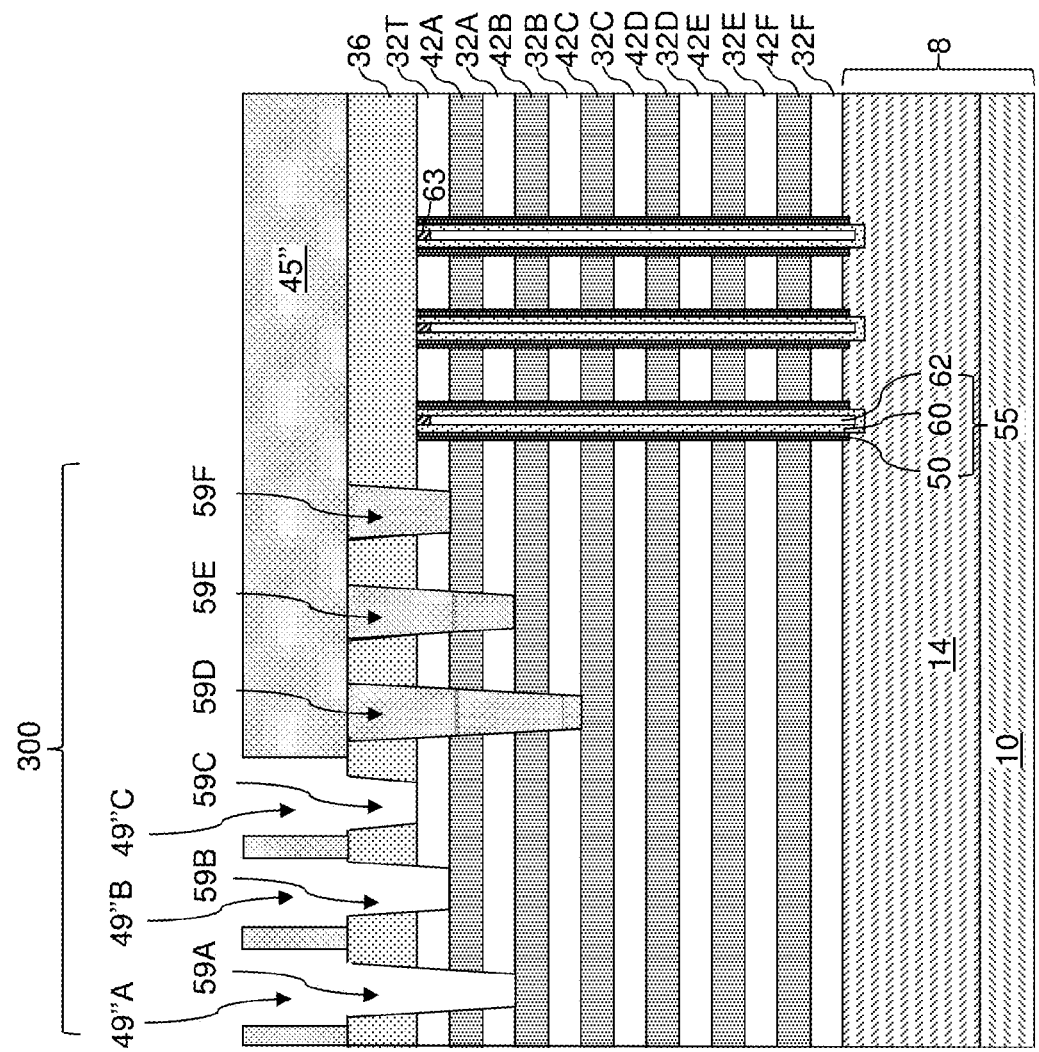

Referring to FIG. 8, a third over mask 45" is formed over the contact mask 36. In various embodiments, the third over mask 45" comprises, for example, a photoresist layer, an organic material layer, a dielectric material layer, or a semiconductor material layer. In some embodiments, the third over mask 45" comprises the same material as the first over mask 45 and/or the second over mask 45'.

The thickness of the third over mask 45" can be in a range from 1 micron to 10 microns, although lesser and greater thicknesses can also be employed. In one embodiment, the third over mask 45" has approximately the same thickness as the first over mask 45 and/or the second over mask 45'.

Similar to the first over mask 45 and the second over mask 45', the third over mask 45" can be patterned with a plurality of third over mask openings 49" to physically expose a third subset of the contact mask openings 59 that is different from the first subset exposed by the first over mask 45 and/or the second subset exposed by the second over mask 45'. In the embodiment shown in FIG. 8, third over mask openings 49"A, 49"B, and 49"C are substantially aligned with and expose contact mask openings 59A, 59B, and 59C, while contact mask openings 59D, 59E, and 59F are covered by a remaining portion of the third over mask 45". The third over mask 45" may be patterned by any method, for example a method described above with respect to the first over mask 45. A remaining portion of the third over mask 45" fills contact mask openings 59D, 59E, and 59F in the contact mask 36 except the contact mask openings 59A, 59B, and 59C.

The cross-sectional dimensions of the third over mask openings 49" may be the same dimensions, or have larger dimensions, than the cross-sectional dimensions of each contact opening. In some embodiments, each third over mask opening 49" is larger than the corresponding contact mask opening 59.

Figure 9:
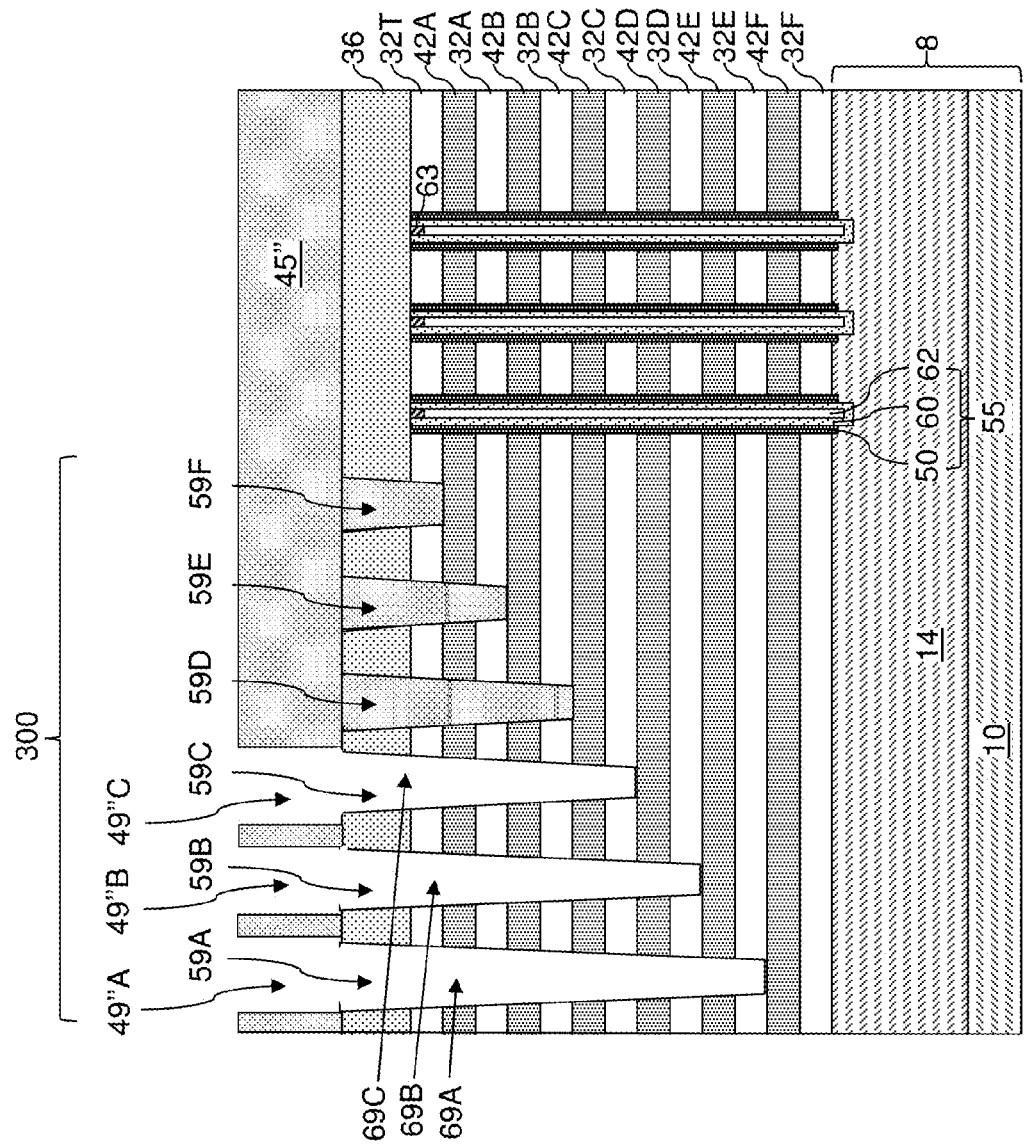

A portion of the stack (32,42) underlying the contact mask openings 59A, 59B, and 59C is anisotropically etched employing the combination of the contact mask 36 and the third over mask 45". As shown in FIG. 9, a portion of the topmost insulator layer 32T underlying the contact mask openings 59C is anisotropically etched employing the combination of the contact mask 36 and the third over mask 45" as an etch mask to form contact opening 69C. An anisotropic etch process is performed to vertically extend the contact openings 69A, 69B, and 69C downward through three pairs of the sacrificial layers 42 and the insulator layers 32.

Figure 10:
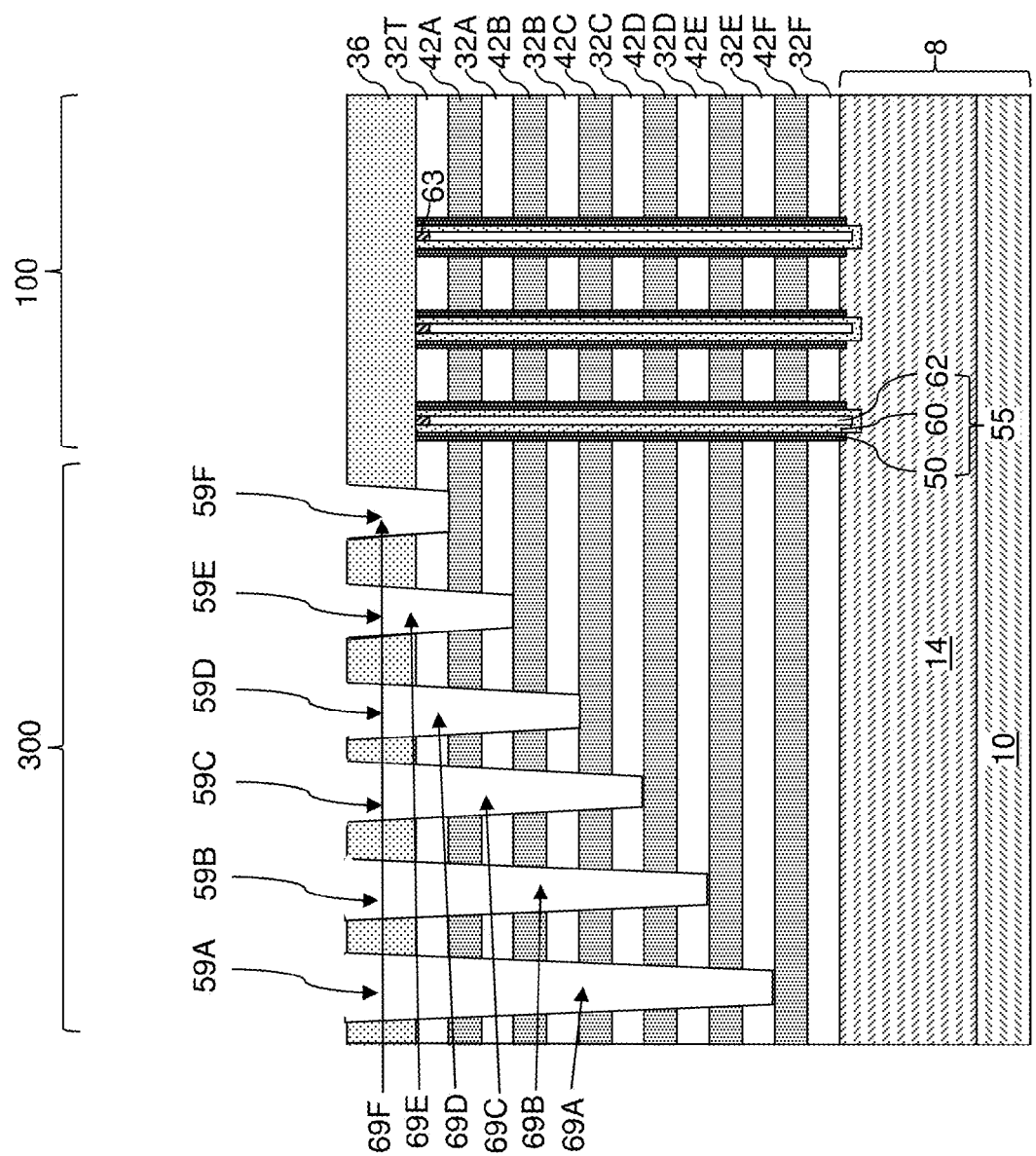

As shown in FIG. 10, the third over mask 45" is then removed.

A cycle of applying an over mask (e.g., first over mask 45, second over mask 45', and third over mask 45") over the contact mask 36 to expose a subset of contact mask openings 59 and an etch process through the subset of contact mask openings 59 has the effect of extending the depth of each contact opening 69 correlating to the subset of contact mask openings 59 exposed by the particular over mask. The depth of each contact opening 69 is measured from the periphery of the topmost portion of the contact opening 69, i.e., from the horizontal plane including the top surface of the mask layer 36.

Additional contact openings can be formed and the depths of pre-existing contact openings can be vertically extended by iteratively, and alternately, performing over mask formation and etch processes. The processing conditions of each over mask formation and etch processes can be substantially the same as in the corresponding over mask formation of FIGS. 2, 5, and 8, and the corresponding etch process of FIGS. 3, 6, and 9. Portions of the alternating stack (32, 42) located underneath contact mask openings 59 that are not covered by the over mask are etched in each of the etch processes.

Each contact opening 69 that is present at an end of a previous etch process vertically extends downward during the next etch process by the total thickness of one or more pairs of a sacrificial layer 42 and an insulator layer 32 that is located immediately below the contact opening 69 at the end of the previous etch process. Each etch process extends the depth of each pre-existing contact opening 69 by the total thickness of one or more pairs of a sacrificial layer 42 and an insulator layer 32 that is located immediately below the respective pre-existing contact opening 69. A particular over mask may be used to etch more than one pair of sacrificial layer 42 and insulator layer 32.

In one embodiment, the etch chemistry for the step of etching the material of the sacrificial layers 42 can be selective to the material of the insulator layers 32, and the etch chemistry for the step of etching the material of the insulator layers 32 can be selective to the material of the sacrificial layers 42. Under such conditions, the recessing of the bottom surfaces of the contact openings 69 during a processing step that etches one type of material, i.e., the first material of the insulator layers 32 or the second material of the sacrificial layers 42, can be self-stopping on the top surface of the immediately underlying material.

In some embodiments, during the process for forming each over mask, the over mask material, for example photoresist, is applied over the contact mask 36 and also fills existing contact openings 69.

In one embodiment, the plurality of contact openings 69 can be formed as multiple sets of linearly positioned contact openings 69. For example, a plurality of first contact openings 69A can be formed in a first linear configuration, and a plurality of i-th contact openings 69 can be formed in an i-th linear configuration that extends along the horizontal direction of the plurality of first contact openings 69A for every integer i greater than 1 and not greater than N, which is the total number of the sacrificial layers 42. As used herein, a "linear configuration" refers to a configuration in which multiple elements are located at positions laterally spaced from one another such that a straight line passing through the multiple elements exists.

Multiple linear sets of contact openings 69 can be formed such that each linear set of contact openings 69 has the same depth, while contact openings belonging to different linear sets have different depths. Each linear set of contact openings 69 having the same depth can laterally extend along a first horizontal direction. As shown in FIG. 2A, contact mask openings 59B and 59B' can be subject to an etch process to form to a set of linearly positioned contact openings. Different linear sets of contact openings 69 (e.g., 69B and 69B', and 69D and 69D', as shown in FIG. 3A) can laterally extend along a second horizontal direction that is different from the first horizontal direction. In one embodiment, the second horizontal direction can be orthogonal to the first horizontal direction.

While the present disclosure has been described employing an embodiment in which a step for etching the second material of the sacrificial layers 42 precedes a step for etching the first material of the insulator layers 32 in an etch process within each cycle of a trimming process and an etch process, an alternative embodiment is expressly contemplated herein, in which a step for etching the first material of the insulator layers 32 precedes a step for etching the second material of the sacrificial layers 42 in an etch process within each cycle of forming an over mask and an etch process. In this case, the last etch process that follows the formation of an over mask may include only the step of etching the first material of the insulator layers 32, i.e., may not include a step for etching the second material of the sacrificial layers 42.

A plurality of contact openings 69 is formed within the alternating stack (32, 42). Each of the plurality of contact openings 69 extends at least from the topmost surface of the alternating stack (32, 42), and specifically from the top surface of the mask layer 36, to a surface of a respective material layer. The respective material layers can include sacrificial layers 42 located at different levels within the alternating stack (32, 42) in case each etch process terminates with a step that etches the second material of the sacrificial layers 42. Alternatively, the respective material layers can include insulator layers 32 located at different levels within the alternating stack (32, 42) in case each etch process terminates with a step that etches the first material of the insulator layers 32.

Referring to FIG. 10, the cycles of alternating processes that include forming an over mask and an etch process continues until the entire set of contact mask openings 59 in the contact mask 36 are physically exposed. The entirety of the remaining portion of the last over mask can be removed after the last etching process. In one embodiment, all of the contact mask openings 59 in the contact mask 36 can be physically exposed. Upon completion of the final etch process, a plurality of contact openings 69 extend through a respective opening in the contact mask 36 from the top surface of the mask layer to a respective one of the plurality of sacrificial layers 42.

Upon termination of the processing steps of FIG. 10, each of the plurality of contact openings 69 can extend at least from the topmost surface of the alternating stack (32, 42), and specifically from the top surface of the contact mask 36, to a surface of a respective sacrificial layer 42. In one embodiment, the bottom surface of each contact opening 69 is a top surface a respective sacrificial layer 42. The top surface the respective sacrificial layer 42 can be the topmost surface of the respective sacrificial layer 42 or a recessed surface of the respective sacrificial layer 42 that is vertically offset from the topmost surface of the respective sacrificial layer 42 due to an overetch or a finite selectivity of the last etch step that etches the first material of the insulator layers 32.

Thus, a first contact opening 69A among the plurality of contact openings 69 has a bottom surface that is a top surface of a first sacrificial layer 42 (e.g., the N-th-from-top sacrificial layer 42F) in the alternating stack (32, 42), a second contact opening 69B among the plurality of contact openings 69 has a bottom surface that is a top surface of a second sacrificial layer 42 (e.g., the (N−1)-th-from-top sacrificial layer 42E) in the alternating stack (32, 42), in which the second sacrificial layer 42 is different from the first sacrificial layer 42. In general, an i-th contact opening 69 can have a bottom surface that is a top surface of the (N+1−i)-th-from-top sacrificial layer 42 in the alternating stack (32, 42).

The sidewall of the contact openings 69 can be vertical, substantially vertical, or tapered depending on the chemistries of the anisotropic etch processes employed during the cycles of a trimming process and an etch process. In one embodiment, the sidewalls of each contact opening 69 can be smooth surfaces without substantial protrusions or recesses. The sidewalls of contact opening 69A include sidewalls of the topmost insulator layer 32, sidewalls of each i-th-from-top sacrificial layer 42 for each integer index i beginning from 1 and ending with N−1, and sidewalls of each j-th-from-top sacrificial layer 42 for each integer index j beginning from 1 and ending with N−1. For every positive integer k less than N, the sidewalls of each k-th contact opening 69 include sidewalls of the topmost insulator layer 32, sidewalls of each i-th-from-top sacrificial layer 42 for each integer index i beginning from 1 and ending with N−k, and sidewalls of each j-th-from-top sacrificial layer 42 for each integer index j beginning from 1 and ending with N−k. The sidewalls of each N-th contact opening 69F include sidewall of the topmost insulator layer 32.

In one embodiment, at least one of the plurality of contact opening 69 (e.g., a first contact opening 69A) can have a first periphery contained entirety within a sidewall of one of the sacrificial layers 42 (e.g., the N-th-from-top sacrificial layer 42F) and a second periphery contained entirely within a sidewall of another of the sacrificial layers 42 (e.g., the (N−1)-th-from-top sacrificial layer 42E). As used herein, a periphery is a closed line that is topologically homeomorphic to a circle. In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top insulator layer 32D).

Figure 11:
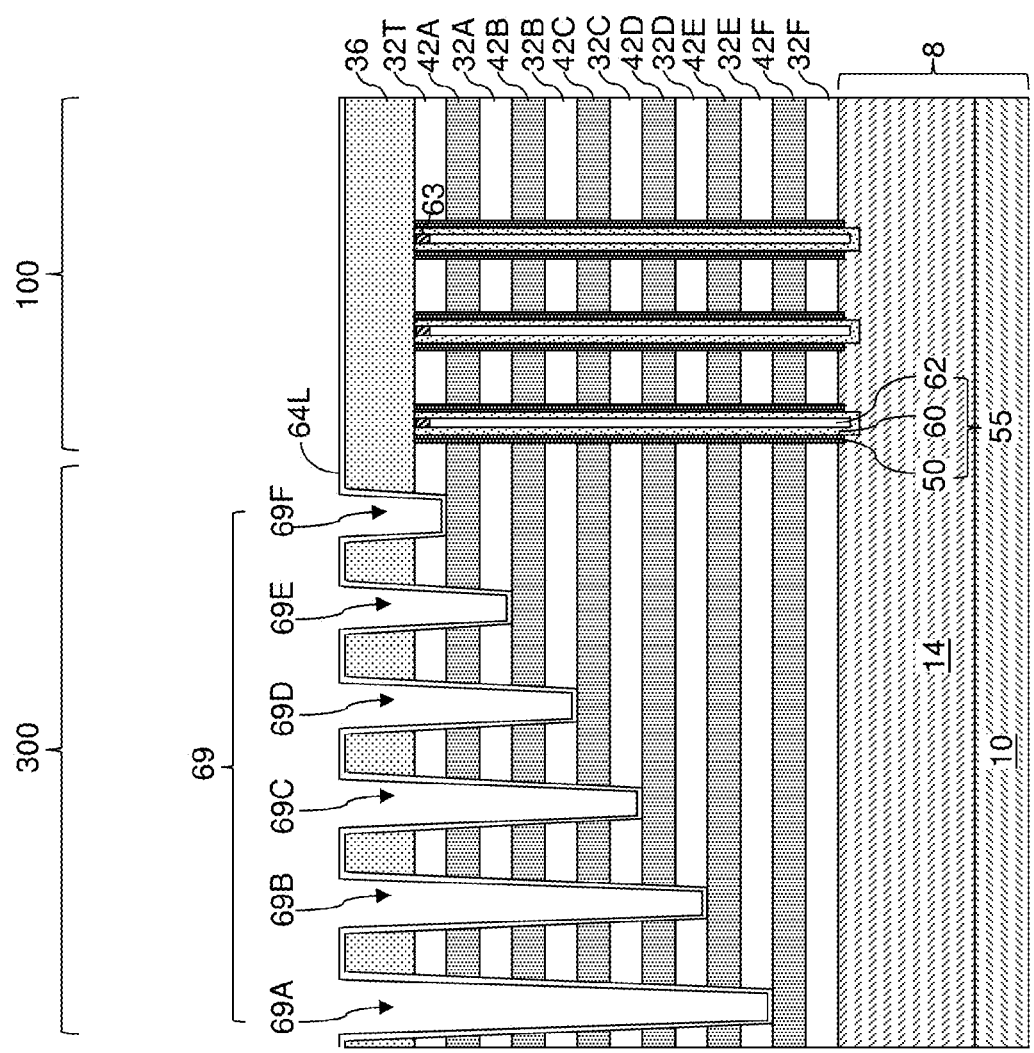

Referring to FIG. 11, a contiguous insulating material layer 64L can be formed on physically exposed surfaces on an upper side of the first exemplary structure, which include the top surface of the contact mask 36, the sidewalls of the plurality of contact openings 69, and the surfaces of the various sacrificial layers 42 underneath the plurality of contact openings 69 (i.e., the bottom surfaces of the contact openings 69). The contiguous insulating material layer 64L includes an insulating material that is different from the second material, i.e., the material of the sacrificial layers 42. For example, the contiguous insulating material layer 64L can include silicon oxide or a dielectric metal oxide such as aluminum oxide, tantalum oxide, and/or hafnium oxide. The contiguous insulating material layer 64L can be deposited, for example, by a conformal deposition method such as chemical vapor deposition (CVD) or atomic layer deposition (ALD). The thickness of the contiguous insulating material layer 64L, as measured at a bottom portion of a first contact opening 69A, can be in a range from 1 nm to 60 nm, although lesser and greater thicknesses can also be employed. In one embodiment, the thickness of the contiguous insulating material layer 64L can be in a range from 3 nm to 30 nm.

Figure 12:
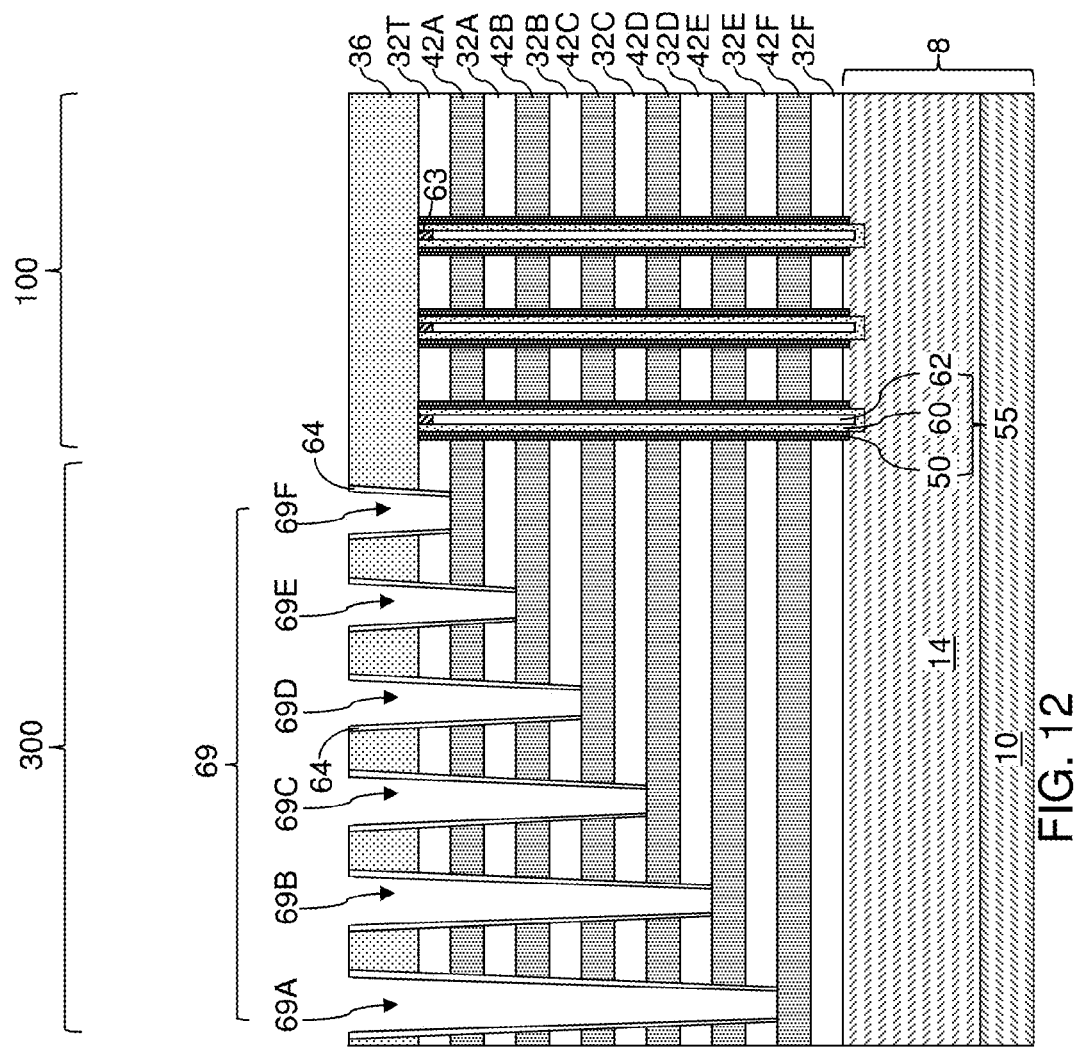

Referring to FIG. 12, insulating liners 64 can be formed on each sidewall of the plurality of contact openings 69 by performing an anisotropic etch of the contiguous insulating material layer 64L. Specifically, upon anisotropically etching the contiguous insulating material layer 64L, each remaining portion of the contiguous insulating material layer 64L constitutes an insulating liner 64. The insulating material of the contiguous insulating material layer 64L is removed from each bottom portion of the plurality of contact openings 69. Thus, a portion of a top surface of a sacrificial layer 42 is physically exposed at the bottom of each of the plurality of contact openings 69. The insulating liners 64 can be formed simultaneously directly on the sidewalls of the plurality of contact openings 69. Each insulating liner 64 can be topologically homeomorphic to a torus.

Figure 13:
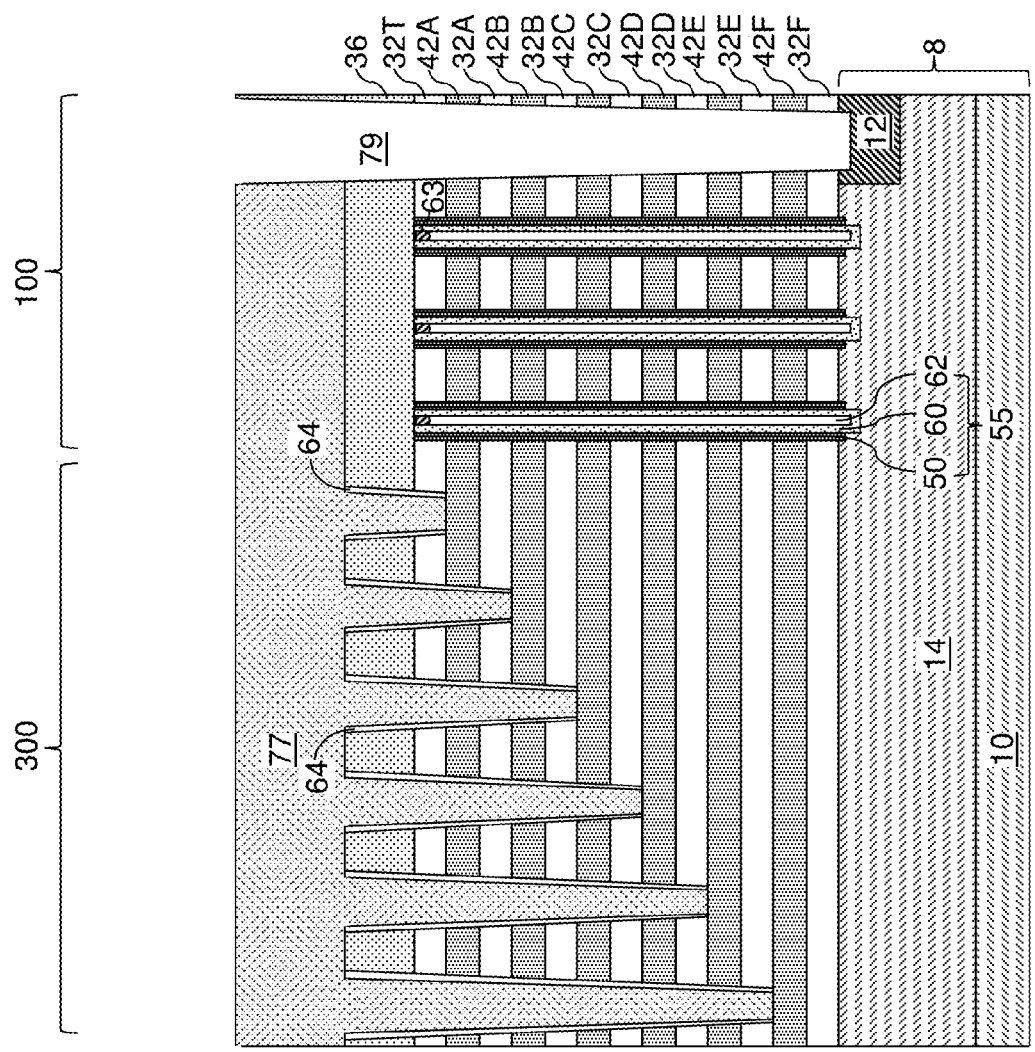

Referring to FIG. 13, a photoresist layer 77 can be applied over the contact mask 36 and lithographically patterned to form at least one backside contact trench 79 in an area in which formation of a backside contact 76 is desired. The photoresist layer 77 can be a conformal photoresist layer that fills, partially or completely, all openings under the topmost surface of the contact mask 36. The pattern in the photoresist layer 77 can be transferred through the mask layer 36 and the alternating stack (32, 42) employing an anisotropic etch to form a trench that extends at least to the top surface of the substrate 8. The trench that extends at least to the top surface of the substrate 8 is a contact opening, and can be a source contact opening. In one embodiment, electrical dopants (i.e., p-type dopants or n-type dopants) can be implanted into the portion of the doped well 14 (or the substrate semiconductor layer 10) to form a source region 12 for vertical memory devices including the channel and memory structures 55. The photoresist layer 77 can be subsequently removed, for example, by ashing.

Figure 14:
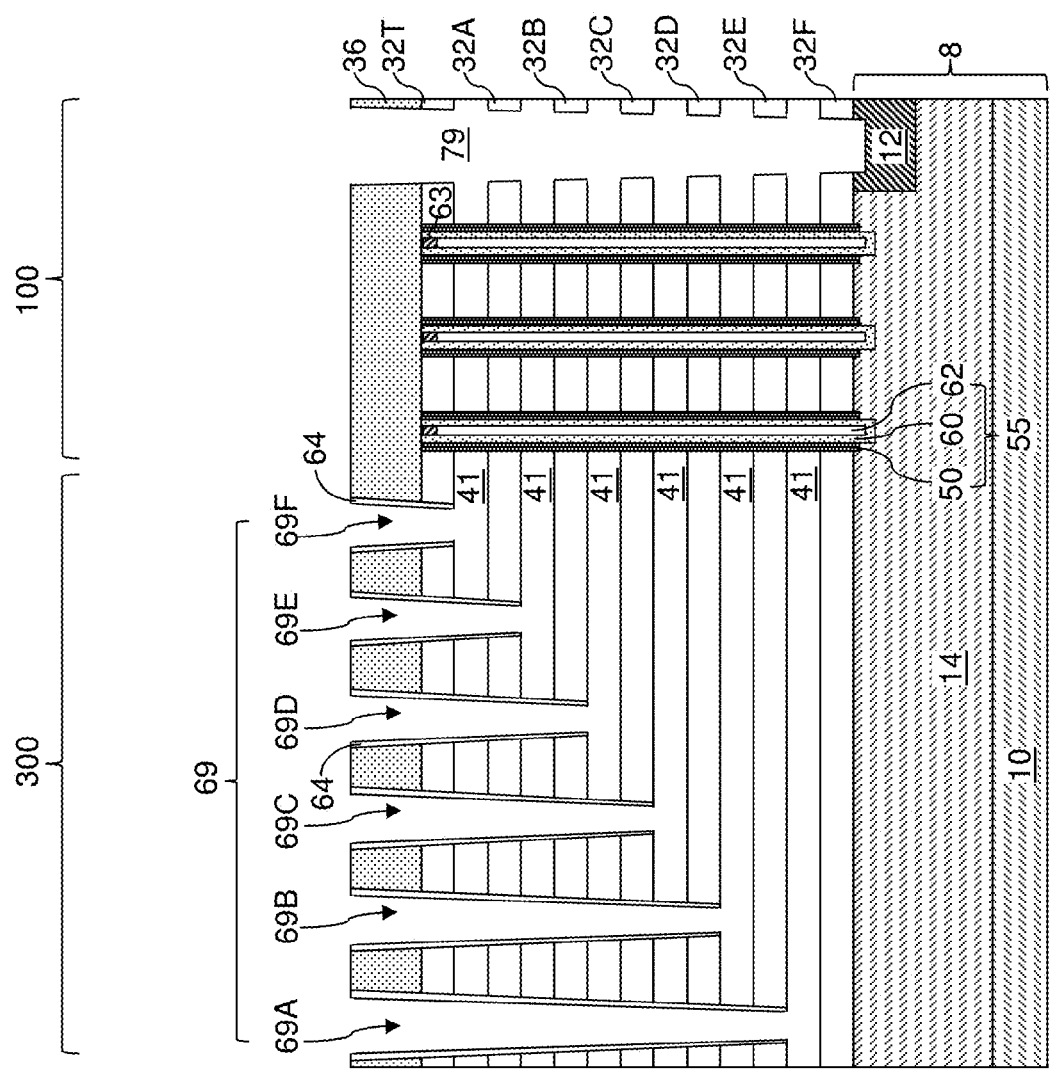

Referring to FIG. 14, an etchant that selectively etches the second material of the sacrificial layers 42 with respect to the first material of the insulator layers 32 can be introduced into the plurality of contact openings 69 and the at least one backside contact trench 79, for example, employing an etch process. The removal of the second material of the sacrificial layers 42 can be selective to the materials of the insulating liners 64, the first material of the insulator layers 32, and the material of the outermost layer of the memory films 50. Optionally, the removal of the second material of the sacrificial layers 42 can be selective to the material of the contact mask 36, and the various conductive materials that are present underneath the peripheral contact openings 89. The insulating liners 64 protect the sidewalls of each of the plurality of contact openings 69 from an etchant used to remove at least a portion of each sacrificial layer 42.

The etch process that removes the second material selective to the first material and the outermost layer of the memory films 50 can be a wet etch process employing a wet etch solution, or can be a gas phase (dry) etch process in which the etchant is introduced in a vapor phase into the plurality of contact openings 69 and the at least one backside contact trench 79. For example, if the sacrificial layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The insulating liners 64, the channel and memory structures 55, and the insulating layers 32 structurally support the first exemplary structure. If desired, additional support pillars (e.g., insulating support pillars which are located outside the plane of FIG. 14) may extend through the stack to support the structure.

Each contiguous portion of the sacrificial layers 42 having a top surface that is physically exposed to one of the plurality of contact openings 69 can be removed during the etch process to form a recess 41, as shown in FIG. 14. Each recess 41 can be a laterally extending cavity having a lateral dimension that is greater than the vertical extent of the cavity. A plurality of recesses 41 can be formed in the volumes from which the second material of the sacrificial layer 42 is removed. The memory openings in which the channel and memory structures 55 are formed are herein referred to as front side cavities, and the recesses 41 are herein referred to as back side cavities. In one embodiment, the device region comprises an array of monolithic three dimensional NAND strings having a plurality of device levels disposed above the substrate 8. In this case, each recess 41 can define a space for receiving a respective word line of the array of monolithic three dimensional NAND strings.

Each of the plurality of recesses 41 can extending substantially parallel to the top surface of the substrate 8. In one embodiment, each recess 41 can be vertically bounded by a top surface of an underlying insulator layer 32 and a bottom surface of an overlying insulator layer 32 except in regions at which the recess is connected to one of the contact openings 69. In one embodiment, each recess 41 can have a uniform height throughout. A bottom portion of each of the plurality of contact openings 69 can be connected to an underlying recess 41. During the etch process that forms the plurality of recesses 41, the insulating liners 64 can protect the sidewalls of the plurality of contact openings 69. Thus, an insulating liner 64 can laterally separate a contact opening 69 from all recesses 41 that are located above the recess 41 to which the contact opening 69 is contiguously connected to through a bottom opening of the contact opening 69. The recesses 41 are formed across multiple levels, and as a result, a first recess 41 formed by removal of a portion of a first sacrificial layer 42 can be located at a different level than a second recess 41 formed by removal of a portion of a second sacrificial layer 42 that is different from the first sacrificial layer 42.

Figure 15:
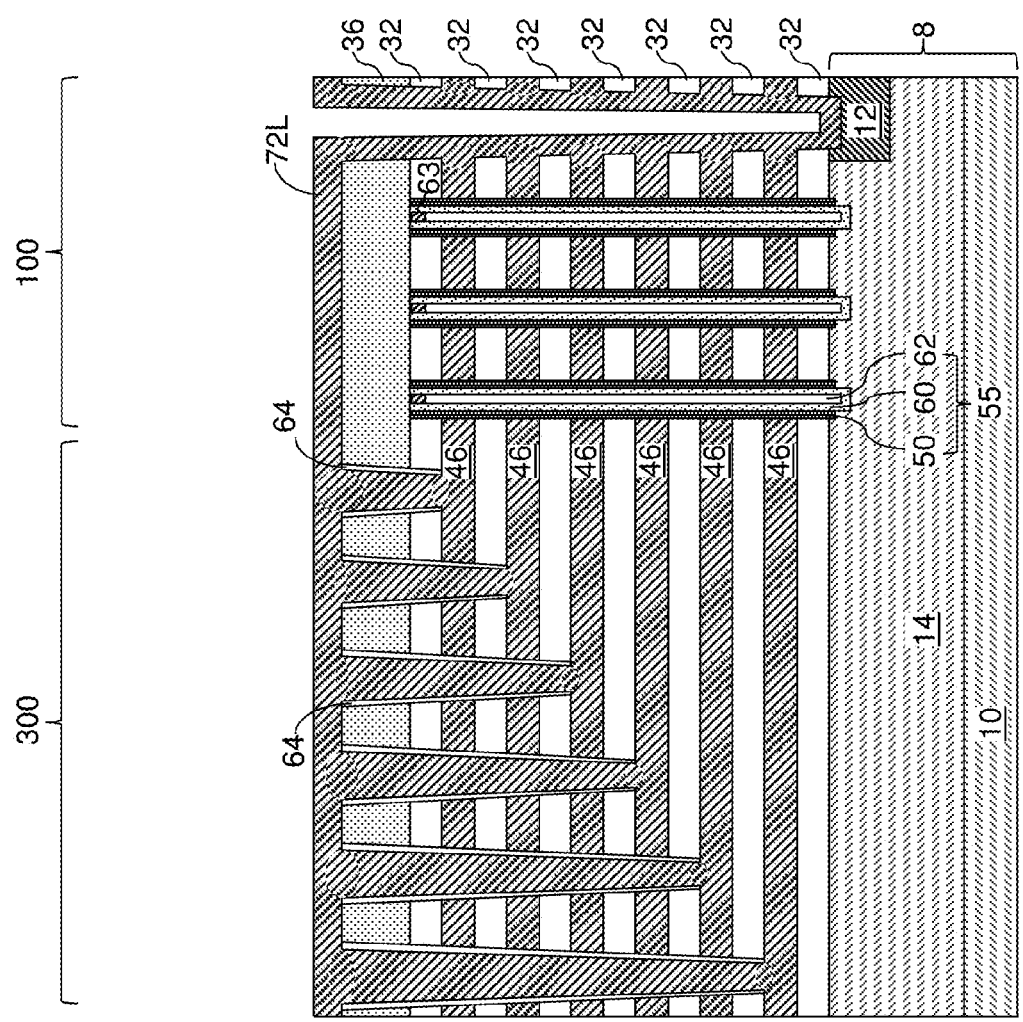

Referring to FIG. 15, a conductive material can be simultaneously deposited in the plurality of contact openings 69 and the plurality of recesses 41, the backside contact trench 79, and over the top surface of the contact mask 36. The conductive material is herein referred to as a first conductive material, or an electrically conductive electrode material. The first conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of contact openings 69 and the plurality of recesses 41 include tungsten, tungsten nitride, titanium, titanium nitride, tantalum, and tantalum nitride. In one embodiment, the electrically conductive electrode material can comprise a metal such as tungsten and/or metal nitride. In one embodiment, the conductive material for filling the plurality of contact openings 69 and the plurality of recesses 41 can be selected from tungsten and a combination of titanium nitride and tungsten. In one embodiment, the conductive material can be deposited by chemical vapor deposition.

Simultaneous deposition of the conductive material in the plurality of contact openings 69 in the plurality of recesses 41, on the sidewalls and the bottom surface of the backside contact trench 79, and over the top surface of the contact mask 36 forms a plurality of electrically conductive electrodes 46 in the plurality of recesses 41 and a contiguous conductive material layer 72L, as shown in FIG. 15. Each electrically conductive electrode 46 can be a conductive line structure. The contiguous conductive material layer 72L includes portions that fill all of the plurality of contact openings 69, a portion formed on the sidewalls of the bottom surface of the backside contact trench 79, and a portion overlying the top surface of the contact mask 36. The contiguous conductive material layer 72L and the plurality of electrically conductive electrodes 46 are formed as an integral structure, i.e., a single contiguous structure.

Figure 16:
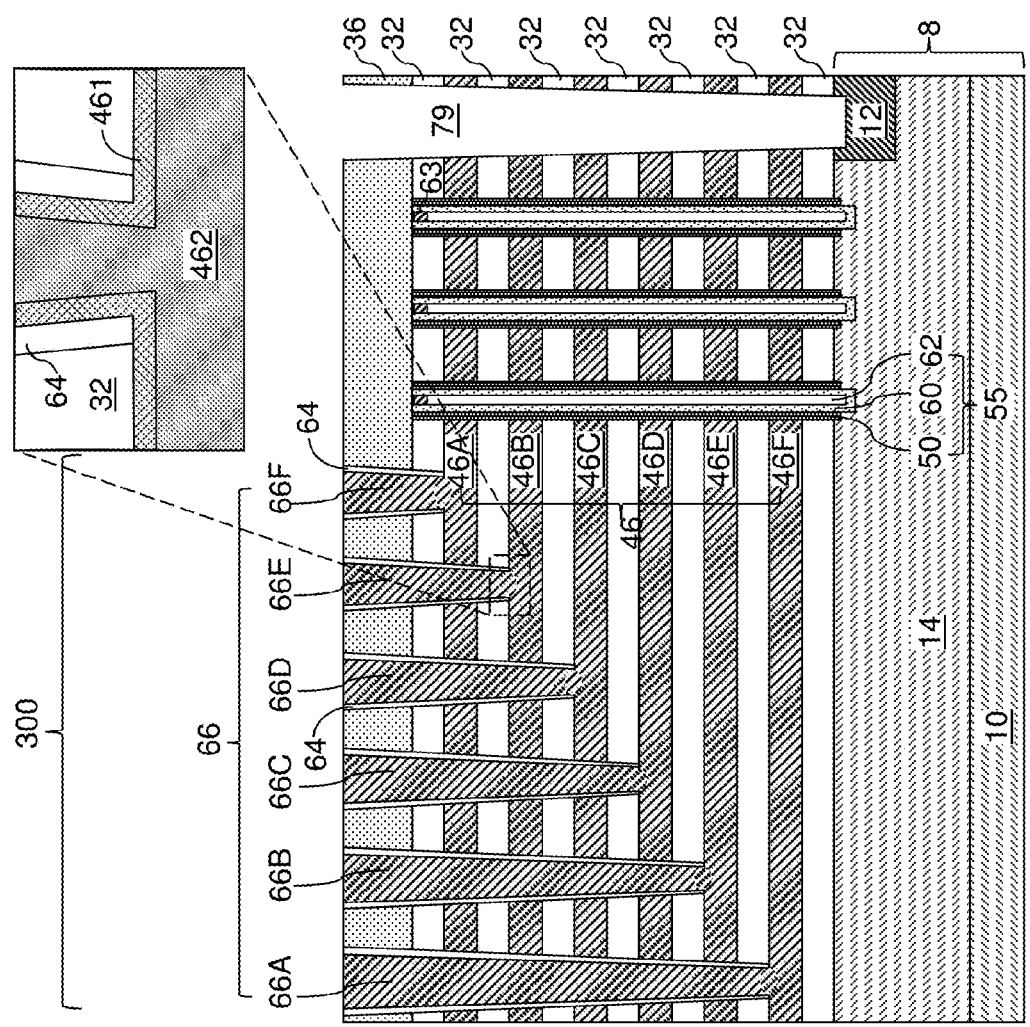

Referring to FIG. 16, portions of the deposited conductive material is etched back, for example, by an isotropic etch. The portion of the contiguous conductive material layer 72L overlying the top surface of the contact mask 36 and the portion of the contiguous conductive material layer 72L located within the backside contact trench 79 are removed. Each remaining portion of the deposited conductive material in the plurality of contact openings 69 constitutes an electrically conductive via contact 66. Each remaining portion of the deposited conductive material in the recesses 41 constitutes an electrically conductive electrode 46. Each electrically conductive electrode 46 can be a conductive line structure.

Each of the plurality of electrically conductive via contacts 66 is electrically shorted to an electrically conductive electrode 46, and can be electrically isolated from all other electrically conductive electrodes 46 by the insulating liner 64. Each electrically conductive electrode 46 can be electrically isolated from any other electrically conductive electrodes 46 located at a different level, i.e., from any other electrically conductive electrode 46 that overlies the electrically conductive electrode 46 and from any other electrically conductive electrode 46 that underlies the electrically conductive electrode 46.

Each electrically conductive electrode 46 can function as a combination of a plurality of control gate electrodes and a word line electrically connecting, i.e., electrically shorting, the plurality of control gate electrodes. The plurality of control gate electrodes within each electrically conductive electrode 46 can include control gate electrodes located at the same level for the vertical memory devices including the channel and memory structures 55. In other words, each electrically conductive electrode 46 can be a word line that functions as a common control gate electrode for the plurality of vertical memory devices.

The plurality of electrically conductive via contacts 66 include at least one first electrically conductive via contact 66A that is located within the volume of a first contact opening 69A and is electrically shorted to an electrically conductive electrode 46, which contacts the top surface of the N-th-from-top insulator layer 32F and the bottom surface of the (N−1)-th-from-top insulator layer 32E, and is herein referred to as an N-th-from-top electrically conductive electrode 46F or a first-from-bottom electrically conductive electrode.

The plurality of electrically conductive via contacts 66 can further include at least one second electrically conductive via contact 66B that is located within the volume of a second contact opening 69B and is electrically shorted to an electrically conductive electrode 46, which contacts the top surface of the (N−1)-th-from-top insulator layer 32E and the bottom surface of the (N−2)-th-from-top insulator layer 32D, and is herein referred to as an (N−1)-th-from-top electrically conductive electrode 46E or a second-from-bottom electrically conductive electrode. The plurality of electrically conductive via contacts 66 can further include at least one third electrically conductive via contact 66C that is located within the volume of a third contact opening 69C and is electrically shorted to an electrically conductive electrode 46, which contacts the top surface of the (N−2)-th-from-top insulator layer 32D and the bottom surface of the (N−3)-th-from-top insulator layer, and is herein referred to as an (N−2)-th-from-top electrically conductive electrode 46D or a third-from-bottom electrically conductive electrode. The plurality of electrically conductive via contacts 66 can further include at least one intermediate level electrically conductive via contact 66D that is located within the volume of an intermediate contact opening 69D and is electrically shorted to an electrically conductive electrode 46, which contacts the top surface of an immediately underlying insulator layer 32 and the bottom surface of an immediately overlying insulator layer 32, and is herein referred to as an intermediate electrically conductive electrode. The plurality of electrically conductive via contacts 66 can further include at least one (N−1)-th electrically conductive via contact 66E that is located within the volume of an (N−1)-th contact opening 69E and is electrically shorted to an electrically conductive electrode 46, which contacts the top surface of the second-from-top insulator layer 32B and the bottom surface of the first-from-top insulator layer 32A, and is herein referred to as a second-from-top electrically conductive electrode 46B or an (N−1)-th-from-bottom electrically conductive electrode. The plurality of electrically conductive via contacts 66 further includes at least one N-th electrically conductive via contact 66F that is located within the volume of a first contact opening 69F and is electrically shorted to a topmost electrically conductive electrode 46, which contacts the top surface of the first-from-top insulator layer 32A and the bottom surface of the topmost insulator layer 32, and is herein referred to as the first-from-top electrically conductive electrode 46A or an N-th-from-bottom electrically conductive electrode.

A first electrically conductive electrode 46F can be formed into a first recess 41 (e.g., the recess 41 located directly above the N-th-from-top insulator layer 32F) through the backside contact trench 79 and the first contact opening 69A. A second electrically conductive electrode 46E can be deposited into a second recess 41 (e.g., the recess 41 located directly above the (N−1)-th-from-top insulator layer 32E) through the backside contact trench 79 and the second contact opening 69B in the same deposition step as depositing the first and the second electrically conductive via contacts (66A, 66B). The second electrically conductive electrode 46E extends around the first contact opening 69A and the first electrically conductive via contact 66A is located in the first contact opening 69A. An insulating liner 64 located on the sidewall of the first contact opening 69A and electrically isolates the second electrically conductive electrode 46E from the first electrically conductive via contact 66A located in the first contact opening 69A. The first electrically conductive via contact 66A extends deeper than the second electrically conductive via contact 66B such that bottom surfaces of the plurality of electrically conductive via contacts (66A, 66B, 66C, 66D, 66E, 66F) form a step pattern.

Thus, the alternating stack (32, 46) includes, from top to bottom, a topmost insulator layer 32T, a first-from-top electrically conductive electrode 46A, a first-from-top insulator layer 32A, a second-from-top electrically conductive electrode 46B, a second-from-top insulator layer 32B, an alternating stack including at least one intermediate electrically conductive electrode 46C and at least one intermediate insulator layer 32C, an (N−2)-th-from-top electrically conductive electrode 46D, an (N−2)-th-from-top insulator layer 32D, an (N−1)-th-from-top electrically conductive electrode 46E, an (N−2)-th-from-top insulator layer 32E, an N-th-from-top electrically conductive electrode 46F, and an N-th-from-top insulator layer 32F. It is understood that an insulator layer 32 can refer to any of, or each of, the various insulator layers (32A, 32B, 32C, 32D, 32E, 32F), and an electrically conductive electrode 46 can refer to any of, or each of, the various sacrificial layers (46A, 46B, 46C, 46D, 46E, 46F). Further, insulator layers 32 can refer to any plurality of, or all of, the various insulator layers (32A, 32B, 32C, 32D, 32E, 32F), and electrically conductive electrodes 46 can refer to any plurality of, or all of, the various electrically conductive electrodes (46A, 46B, 46C, 46D, 46E, 46F).

Remaining contiguous portions of the deposited conductive material include a plurality of integrated line and via structures (46, 66). Specifically, each electrically shorted pair of an electrically conductive via contact 66 and an electrically conductive electrode 46 constitutes an integrated line and via structure (46, 66). The first device structure includes a plurality of integrated line and via structures (46, 66) having coplanar topmost surfaces (that are within the horizontal plane including the top surface of the contact mask 36) and bottommost surfaces located at different distances from the horizontal plane including the top surface of the alternating stack (32, 46) of the insulator layers 32 and the electrically conductive electrodes 46. In one embodiment, each instance of the electrically conductive electrodes 46 can be a portion of a respective one of the plurality of integrated line and via structures (46, 66).

Optionally, each integrated line and via structure (46, 66) can include a metallic liner 461 that coats the entire surfaces of a contiguous cavity including a corresponding contact opening 69 and a corresponding recess 41, as shown in FIG. 16. For example, the metallic liners 461 can be a contiguous layer of titanium nitride. Each integrated line and via structure (46, 66) can include a conductive material portion 462 that can be embedded within the metallic liner 461, or can contact the surfaces of insulator layers 32, or can contact a dielectric material liner (not shown) such as a blocking dielectric layer that can be formed within the recesses 41 and the dielectric liners 64 prior to formation of the integrated line and via structures (46, 66). In one embodiment, the conductive material portion 462 can include tungsten. Each conductive material portion 462 can be a structure of integral construction, i.e., a single contiguous structure. Each conductive material portion 462 can include a vertical conductive material portion and a horizontal conductive material portion that do not have any interface there between, but can be divided only geometrically by a discontinuous change in the horizontal cross-sectional area of the conductive material portion as a function of a vertical distance from the top surface of the alternating stack (32, 46).

Each integrated line and via structure (46, 66) can include a contiguous material portion that is contiguous throughout the entirety thereof and does not include any interface therein. Specifically, each of the plurality of integrated line and via structures (46, 66) can comprise an electrically conductive electrode 46 and an electrically conductive via contact 66 that adjoins, and overlies, the electrically conductive electrode 46 such that a contiguous material portion without an interface therein contiguously extends through the electrically conductive electrode 46 and the electrically conductive via contact 66. As used herein, an "interface" refers to any microscopic contiguous surface at which different materials contact each other or a same material is spaced by a microscopic cavity or an impurity layer that is inherently present when one material is formed on another material in any environment that can introduce impurity materials. Because the same material is deposited simultaneously to form each contiguous material portion of the electrically conductive via contact 66 and the electrically conductive electrode within each integrated line and via structure (46, 66), each contiguous material portion in an integrated line and via structure (46, 66) is free of any interface that divides the contiguous material portion into two portions.

In one embodiment, each conductive material portion 462 can be a contiguous material portion within a respective integrated line and via structure (46, 66). In other words, each conductive material portion 462 can be free of any interface therein and contiguously extend through the electrically conductive electrode 46 and the electrically conductive via contact 66 within a respective integrated line and via structure (46, 66). If a metallic liner 461 is present within a line and via structure (46, 66), the metallic liner 461 can be a contiguous material portion that is free of any interface therein and contiguously extends through the electrically conductive electrode 46 and the electrically conductive via contact 66 within the integrated line and via structure (46, 66). Each conductive material portion 462 within an integrated line and via structure (46, 66) can contiguously extend at least from a horizontal plane including the topmost surface of the alternating stack (32, 46) to a sidewall of the conductive material portion 462 located underneath another horizontal plane including a top surface of the electrically conductive electrode 46 within the integrated line and via structure (46, 66).

In one embodiment, each of the plurality of integrated line and via structures (46, 66) can have a topmost surface that is coplanar with the top surface of the alternating stack (32, 46), and electrically conductive electrodes 46 within the plurality of integrated line and via structures (32, 46) can be located at different levels within the alternating stack (32, 46). The different levels are vertically spaced by at least one insulator layer 32. In one embodiment, a dielectric liner 46 can laterally surround each electrically conductive via contact 66 within the plurality of integrated line and via structures (46, 66). Each of the plurality of integrated line and via structures (46, 66) can be electrically isolated from one another by the insulator layers 32 and the dielectric liners 64.

Figure 17:
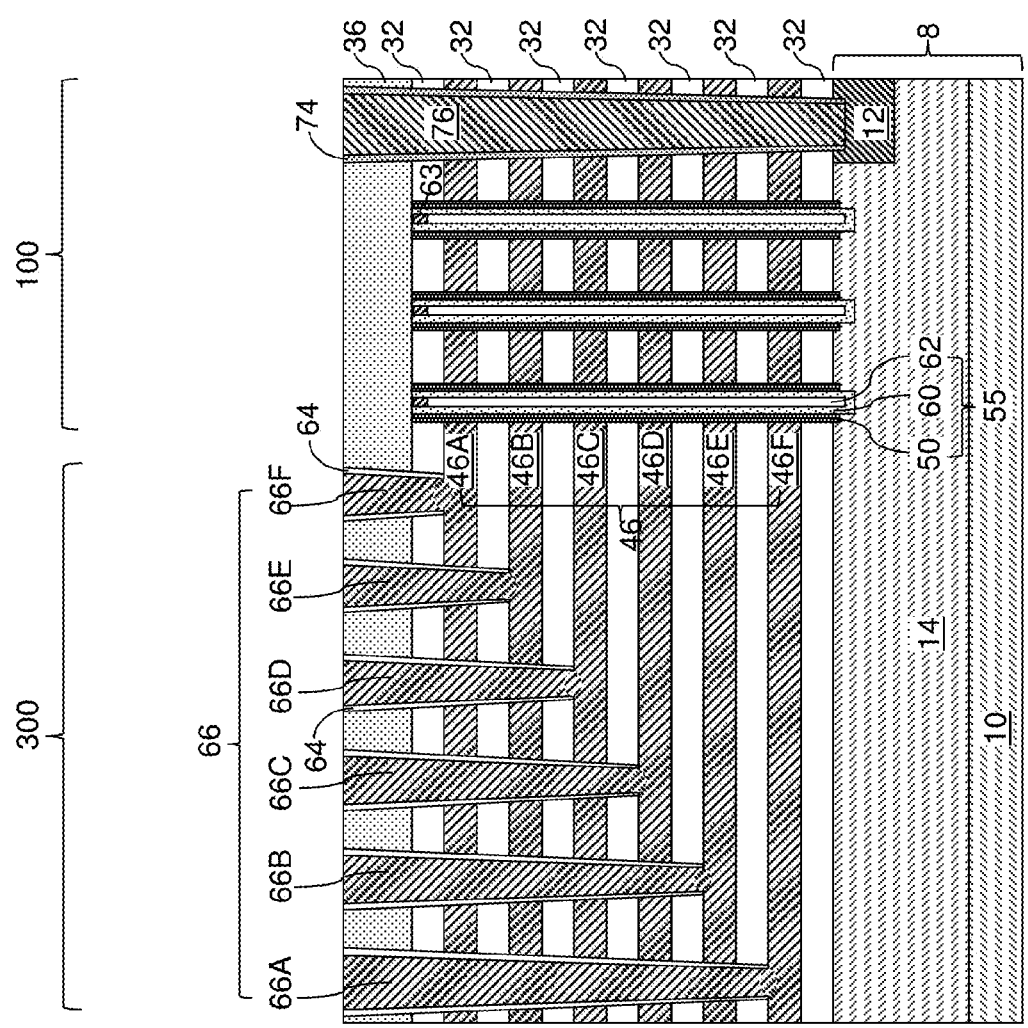

Referring to FIG. 17, an insulating spacer 74 can be formed on the sidewalls of the backside contact trench 79 by deposition of a contiguous dielectric material layer and an anisotropic etch. The insulating spacer 74 includes a dielectric material that can be the same as, or different from, the dielectric material of the insulating liners 64. For example, the insulating spacer 74 can include silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

The backside contact trench 79 can be subsequently filled with a fill layer of another conductive material, which is herein referred to as a second conductive material. The second conductive material can be the same as, or can be different from, the first conductive material, i.e., the conductive material of the integrated line and via structures (46, 66). The second conductive material can be an electrically conducting material, and can include a metal such as tungsten and/or a metal nitride. The deposited second conductive material can be planarized employing the contact mask 36 as a stopping layer for the planarization process. Specifically, the portion of the conductive material formed over a horizontal plane including the top surface of the contact mask 36 can be removed, for example, by chemical mechanical planarization, a recess etch, or a combination of a recess etch and chemical mechanical planarization. Remaining portions of the second conductive material after the planarization process constitutes a backside contact 76, which can provide a vertically conductive electrical path to an electrical node of a device component within, or on, the substrate 8 and underneath the alternating stack (32, 46), as shown in FIG. 17. The backside contact 76 can be a source line electrically connected to the source region 12 in the substrate 8. The top surface of the backside contact 76 can be coplanar with the top surface of the contact mask 36.

In one embodiment, each electrically conductive electrode 46 among the plurality of line and via structures (46, 66) can comprise a word line that function as a common control gate electrode for the plurality of stacked memory devices including the channel and memory structures 55. In one embodiment, at least one of the plurality of contact opening 69 (e.g., a first contact opening 69A) can have a first periphery contained entirely within a sidewall of one of the sacrificial layers 42 (e.g., the N-th-from-top sacrificial layer 42F) and a second periphery contained entirely within a sidewall of another of the sacrificial layers 42 (e.g., the (N−1)-th-from-top sacrificial layer 42E). In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial layer 42D). The first exemplary structure of FIG. 17 includes a memory device, which comprises at least one memory cell located over the substrate 8. Each of the at least one memory cell contains a portion of the semiconductor channel 60 including a vertical portion extending substantially perpendicular to a top, major surface 9 of the substrate 8 and further includes a portion of the memory film 50 contacting an outer sidewall of the semiconductor channel 60. The memory device further comprises an alternating stack (32, 46) of insulator layers 32 and electrically conductive electrodes 46 that laterally surrounds portions of the at least one memory cell. The memory device further comprises a plurality of integrated line and via structures (46, 66) embedded within the insulator layers 32. Each of the plurality of integrated line and via structures (32, 46) comprises a respective one of the electrically conductive electrodes 46 and an electrically conductive via contact 66 that adjoins, and overlies, the respective electrically conductive electrode 46 such that a conductive material portion 462 without an interface therein contiguously extends through the respective electrically conductive electrode 46 and the electrically conductive via contact 66. Each instance of the electrically conductive electrodes 46 is a portion of a respective one of the plurality of integrated line and via structures (46, 66).

In one embodiment, each instance of the electrically conductive electrodes 46 can include a control gate electrode for the at least one memory cell. The memory device can further include a source region 12 located within, or on, the substrate 8 and contacting the at least one semiconductor channel 60. The memory device can further include a drain region 63 located on a top surface of one of the at least one semiconductor channel 60.

The memory device can include a dielectric liner 64 (e.g., the dielectric liner 64 in contact with a first electrically conductive via contact 66A) having an outer sidewall and an inner sidewall. The outer sidewall can contact a first electrically conductive electrode (e.g., the (N−2)-th-from-top electrically conductive electrode 46D) within a first integrated line and via structure (66A, 46F) (e.g., the integrated line and via structure including a third electrically conductive via contact 66C and the (N−2)-th-from-top electrically conductive electrode 46D), and a second electrically conductive electrode (e.g., the (N−1)-th-from-top electrically conductive electrode 46E) within a second integrated line and via structure (66B, 46E) (e.g., the integrated line and via structure including a second electrically conductive via contact 66B and the (N−1)-th-from-top electrically conductive electrode 46E). The second line structure (e.g., the (N−1)-th-from-top electrically conductive electrode 46E) underlies the first line structure (e.g., the (N−2)-th-from-top electrically conductive electrode 46D). The inner sidewall can contact an electrically conductive via contact (e.g., a first electrically conductive via contact 66A) within a third integrated line and via structure (66C, 46D) (e.g., the integrated line and via structure including the first electrically conductive via contact 66A and the N-th-from-top electrically conductive electrode 46F) that contains a third line structure (e.g., the N-th-from-top electrically conductive electrode 46F) underlying the second line structure (e.g., the (N−1)-th-from-top electrically conductive electrode 46E).

Figure 18:
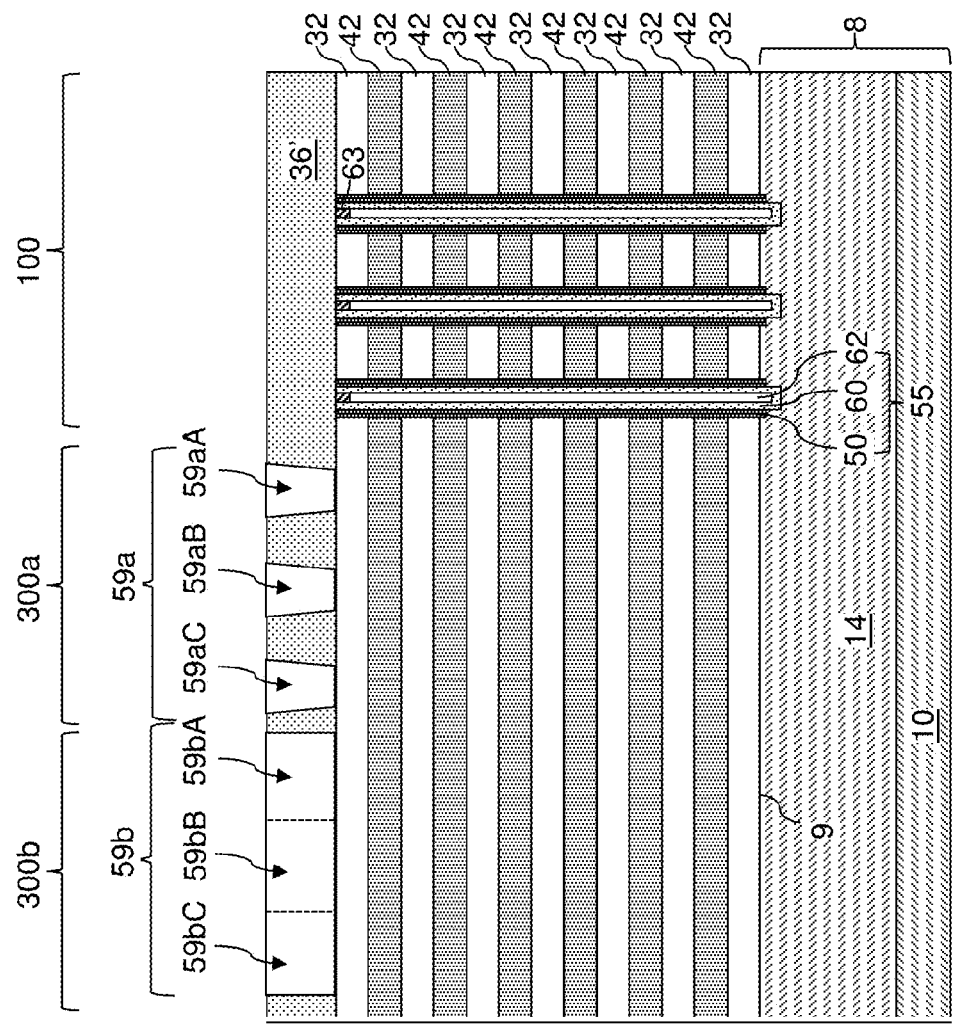
FIGS. 18-28 illustrate sequential vertical cross-sectional views of a second exemplary structure employed to fabricate a device structure containing vertical NAND memory devices according to an aspect of the second embodiment of the present disclosure.

Referring to FIG. 18, a second embodiment of the present disclosure includes using a compound contact mask 36' to form a plurality of contact openings 69 in a first region 300a, and to form a plurality of terrace openings 89 forming a terrace structure 90 having a stepped pattern in a second region 300b.

Figure 18A:
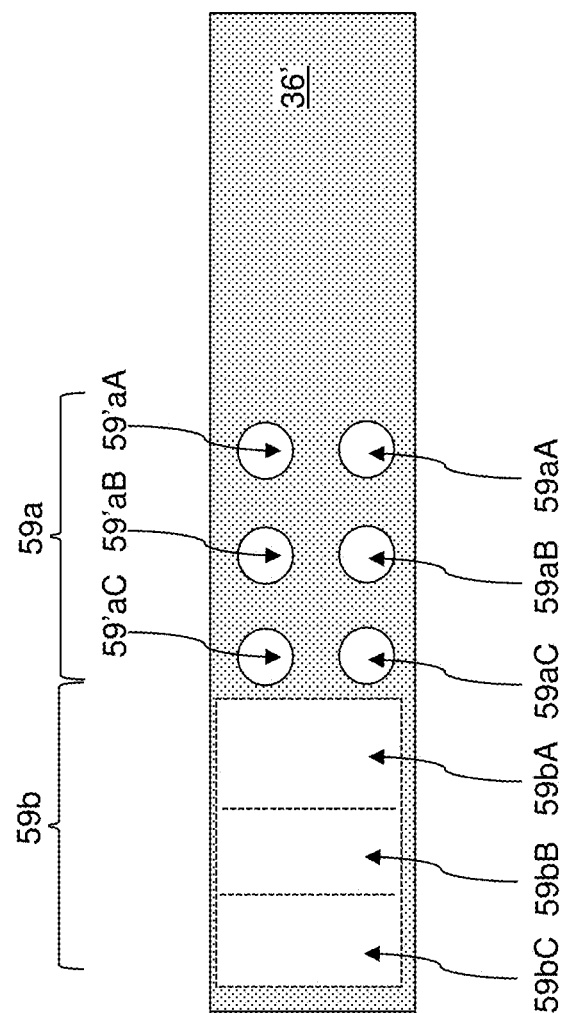
FIG. 18A shows a plan view of the device shown in FIG. 18.

The compound contact mask 36' includes a plurality of contact mask openings 59a, and a terrace mask open area 59b, which contains a plurality of adjacent portions separated by imaginary lines (shown as dashed lines in FIG. 18A). The plurality of portions of the terrace mask open area 59b is referred to herein as a "plurality of terrace mask openings" for brevity. Each contact mask opening 59a is paired with one of the plurality of terrace mask openings 59b. Each contact mask opening 59a results in a contact opening 69, and each terrace mask opening 59b results in a terrace opening 89. In one aspect of the second embodiment shown in FIGS. 18-28, the method includes the use of both the contact mask and a series of over masks having different opening patterns to expose subsets of the openings in the contact mask, and etching the stack (32,42) through the opening patterns, similar to the method of the first embodiment described above. In another aspect of the second embodiment shown in FIGS. 29-30, the contact mask and the series of over masks are replaced by sequential compound contact mask formation and etching of respective paired contact openings 59a and terrace openings 59b. In this aspect, the over masks are omitted. In one aspect of this second embodiment, the paired contact mask opening 59a and the terrace mask opening 59b are preferably included or excluded together from a given subset. Thus, the contact opening 69 resulting from a particular contact mask opening 59a extends to a same layer of the stack (32,42) as the terrace opening 89 resulting from the terrace mask opening 59b paired with the particular contact mask opening 59a.

As shown in FIGS. 18 and 18A, each terrace opening 59bA, 59bB, 59bC (i.e., portions of the terrace mask open area 59b) is larger than a corresponding contact mask opening 59aA, 59aB, 59aC, respectively. The contact mask openings extend in two directions, such as plural contact openings in each row (e.g., 59aA and 59aA', 59aB and 59aB', 59aC and 59aC', etc.) which correspond to a respective contact mask opening (e.g., 59aA, 59aB, 59aC). In some embodiments, contact mask openings 59a are round, and terrace mask openings 59b (and the entire terrace open area) are square or rectangular. In various embodiments, neighboring terrace mask openings 59b are not separated by walls.

In some embodiments, end point detection is difficult during formation of contact openings having high aspect ratios and small cross-sectional dimensions. As used herein "end point detection" and similar terms can include detecting whether a particular layer or depth in the stack has been reached during an etch step. Without wishing to be bound by theory, a larger cross-sectional dimension may, in some embodiments, facilitate end point detection during the anisotropic etch step. Thus, an end point for etching a particular contact opening 69 could be determined by detecting the end point for the counterpart terrace opening 89 paired with the particular contact opening 69 because both openings 69, 89 extend to the same depth in the stack (e.g., to the same layer in the stack).

Figure 19:
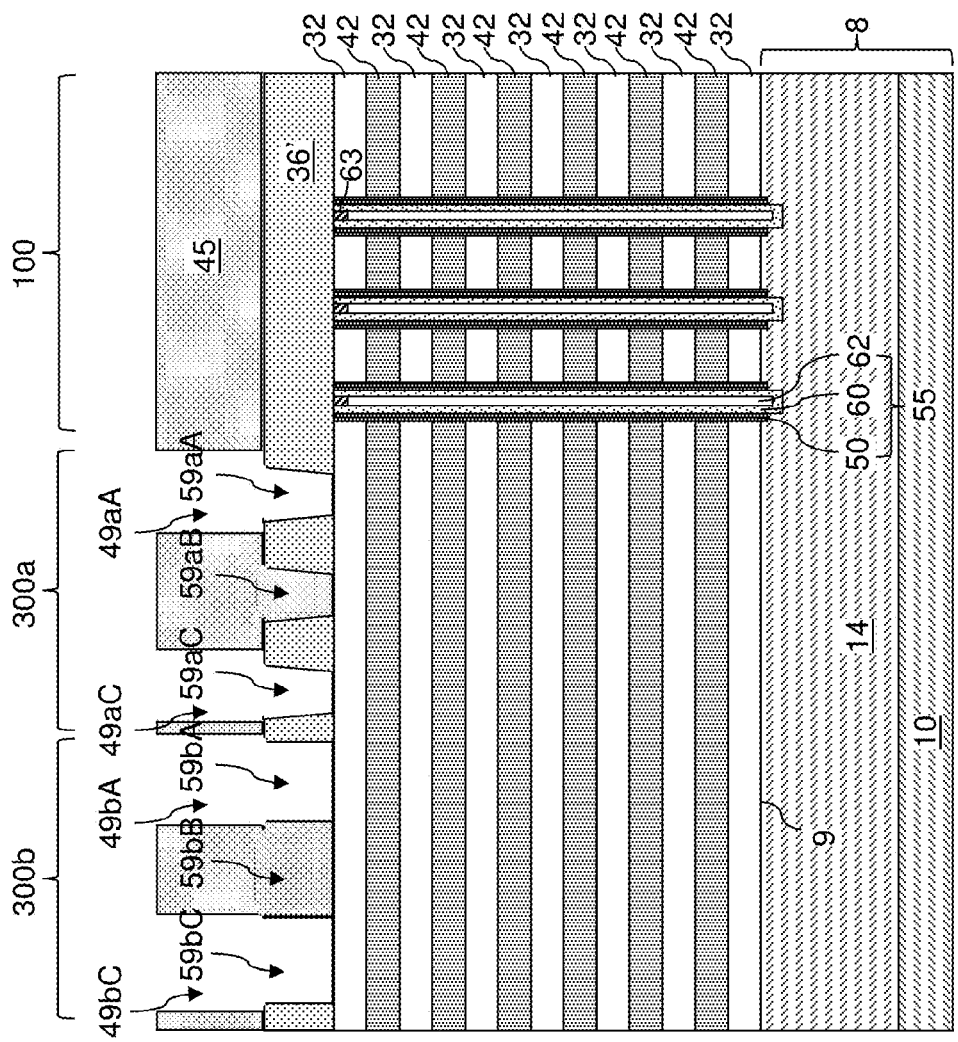

As shown in FIG. 19, a first over mask 45 is formed over the compound contact mask 36' (i.e., a contact mask containing both contact openings 59a and terrace openings 59b). In various embodiments, the first over mask 45 comprises, for example, a photoresist layer, an organic material layer, a dielectric material layer, or a semiconductor material layer.

The first over mask 45 can be patterned with a plurality of first over mask openings 49 to physically expose a first subset of the contact mask openings 59a along with the respective paired terrace mask openings 59b. In the embodiment shown in FIG. 19, first over mask openings 49aA, and 49aC are substantially aligned with and expose contact mask openings 59aA and 59aC, while first over mask openings 49bA, and 49bC are substantially aligned with and expose terrace mask openings 59bA and 59bC. Contact mask opening 59aB and terrace mask opening 59bB are covered by a remaining portion of the first over mask 45. If the first over mask 45 is a photoresist layer, the first over mask 45 can be lithographically patterned, i.e., by a combination of lithographic exposure and development. If the first over mask 45 is not a photoresist layer, the first over mask 45 can be patterned by application of a photoresist layer thereupon, lithographic patterning of the photoresist layer, and etching of the portions of the first over mask 45 that are not covered by the remaining portion of the photoresist layer, for example, by an anisotropic etch. The photoresist layer may be removed after patterning the first over mask 45. A remaining portion of the first over mask 45 fills contact mask opening 59aB and terrace mask opening 59bB in the compound contact mask 36'.

The location and cross-sectional dimensions of each contact opening 69 are determined by the location and cross sectional dimensions of the contact mask openings 59a, and the location and cross-sectional dimensions of each terrace opening 89 are determined by the location and cross-sectional dimensions of the terrace mask openings 59b. Thus, the cross-sectional dimensions of the first over mask openings 49 may be the same dimensions, or have larger dimensions, than the cross-sectional dimensions of each contact opening or terrace opening. In some embodiments, each first over mask opening 49 is larger than the corresponding contact mask opening 59a or terrace mask opening 59b.

Figure 20:
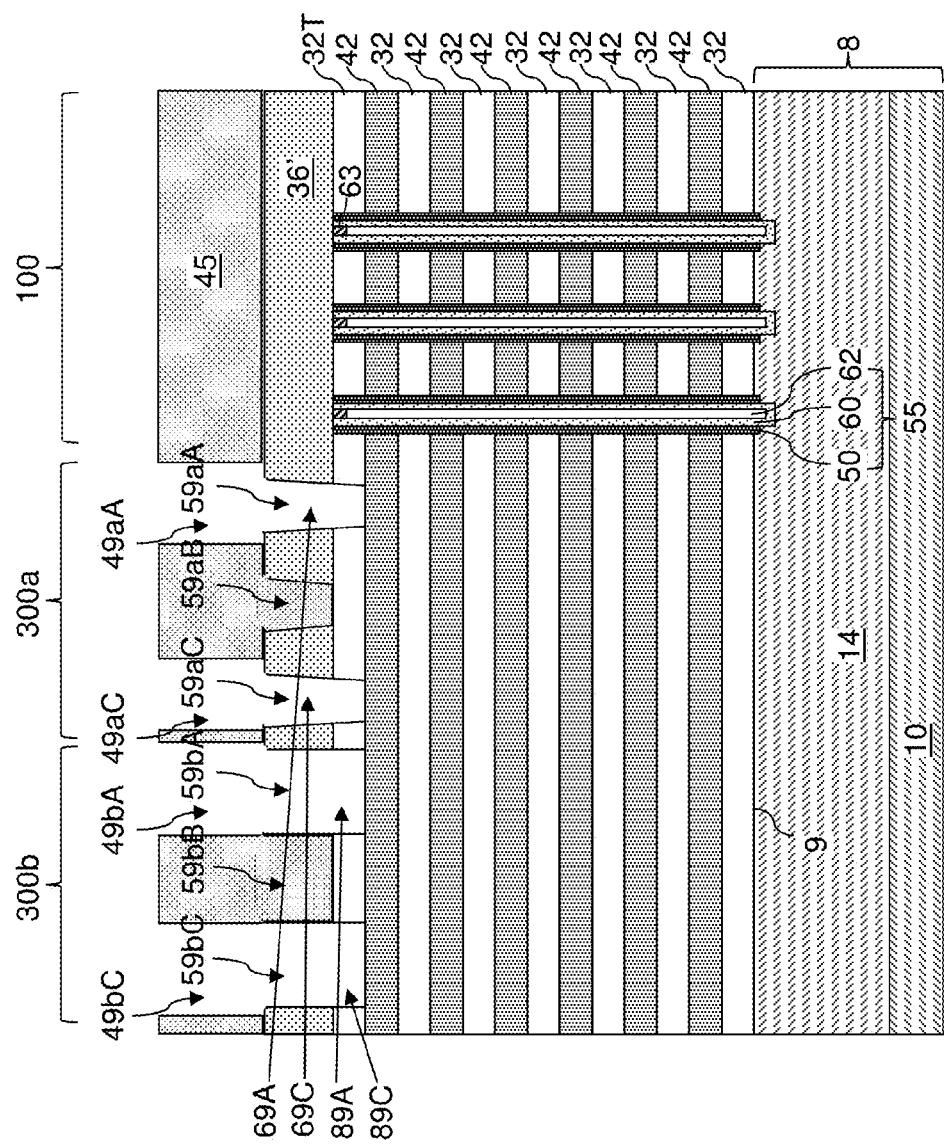

Each portion of the topmost insulator layer 32T underlying the contact mask openings 59aA and 59aC, and terrace openings 59bA and 59bC is anisotropically etched employing the combination of the compound contact mask 36' and the first over mask 45 as an etch mask to form a plurality of contact openings 69 and terrace openings 89. As shown in FIG. 20, contact openings 69aA and 69aC, and terrace openings 89bA and 89bC are formed through the compound contact mask 36' and the topmost insulator layer 32T. In some embodiments, contact openings 69 and terrace openings 89 extend substantially perpendicular to the major surface of the substrate. In one embodiment, the stopping point for the etch process may be determined by detecting the material of the layer that is currently being etched. In one embodiment, the detector detects the etching chemistry in a terrace opening 89. In various embodiments, the etch process is stopped when material from a sacrificial layer 42 is detected in the terrace opening. The terrace opening and corresponding contact opening would then have a bottom surface at a top surface of a sacrificial layer 42. Alternatively, if the etch process is allowed to proceed for a short while after material from a sacrificial layer 42 is detected, then the terrace opening and corresponding contact opening would have a bottom surface within the sacrificial layer 42. In some embodiments, the etch process is stopped when material from an insulator layer 32 is detected. The terrace opening and corresponding contact opening would then have a bottom surface at a top surface of an insulator layer 32. Alternatively, if the etch process is allowed to proceed for a short while after material from an insulator layer 32 is detected, then the terrace opening and corresponding contact opening would have a bottom surface within the insulator layer 32.

Figure 21:
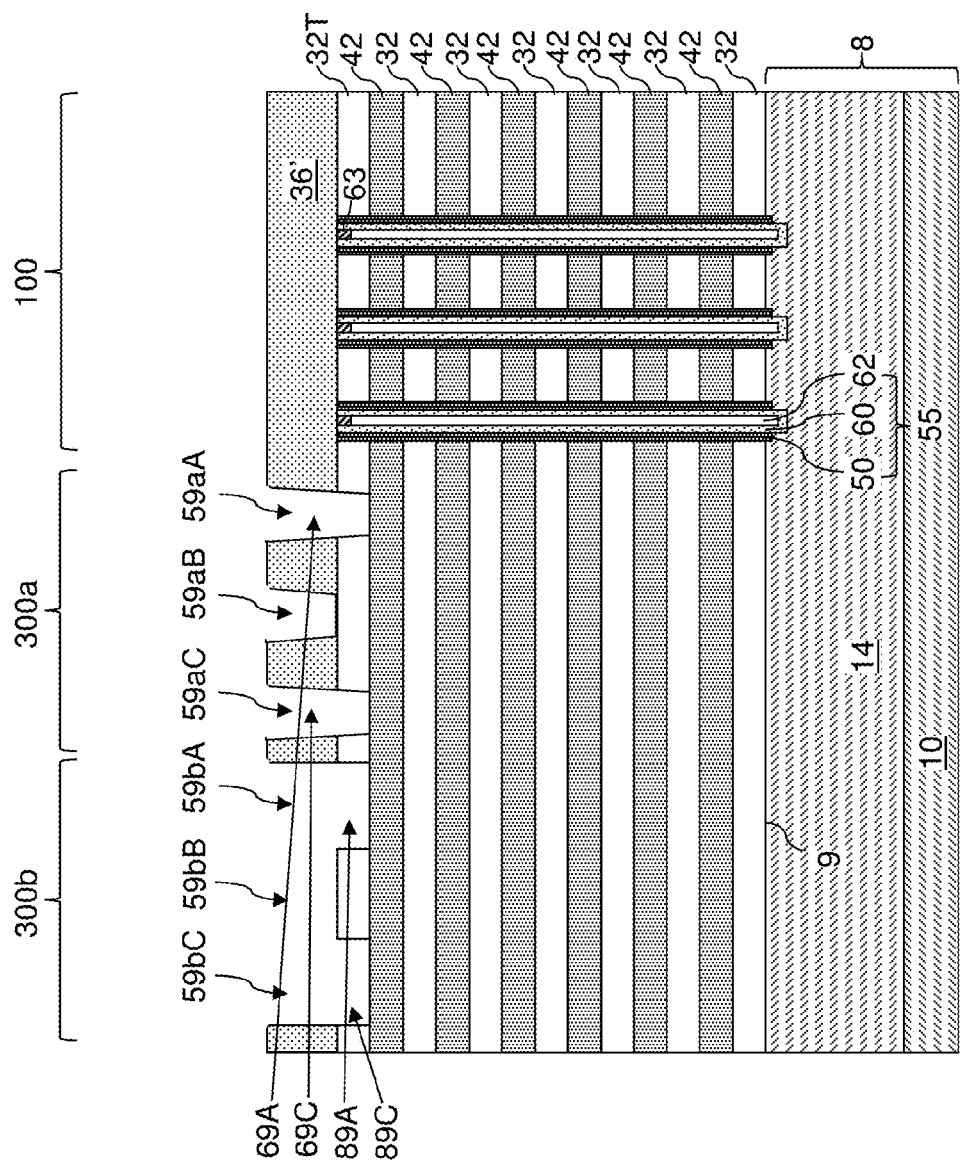

As shown in FIG. 21, the first over mask 45 is then removed. In some embodiments, the first over mask 45 is photoresist, and can be removed, for example, by ashing.

Figure 22:
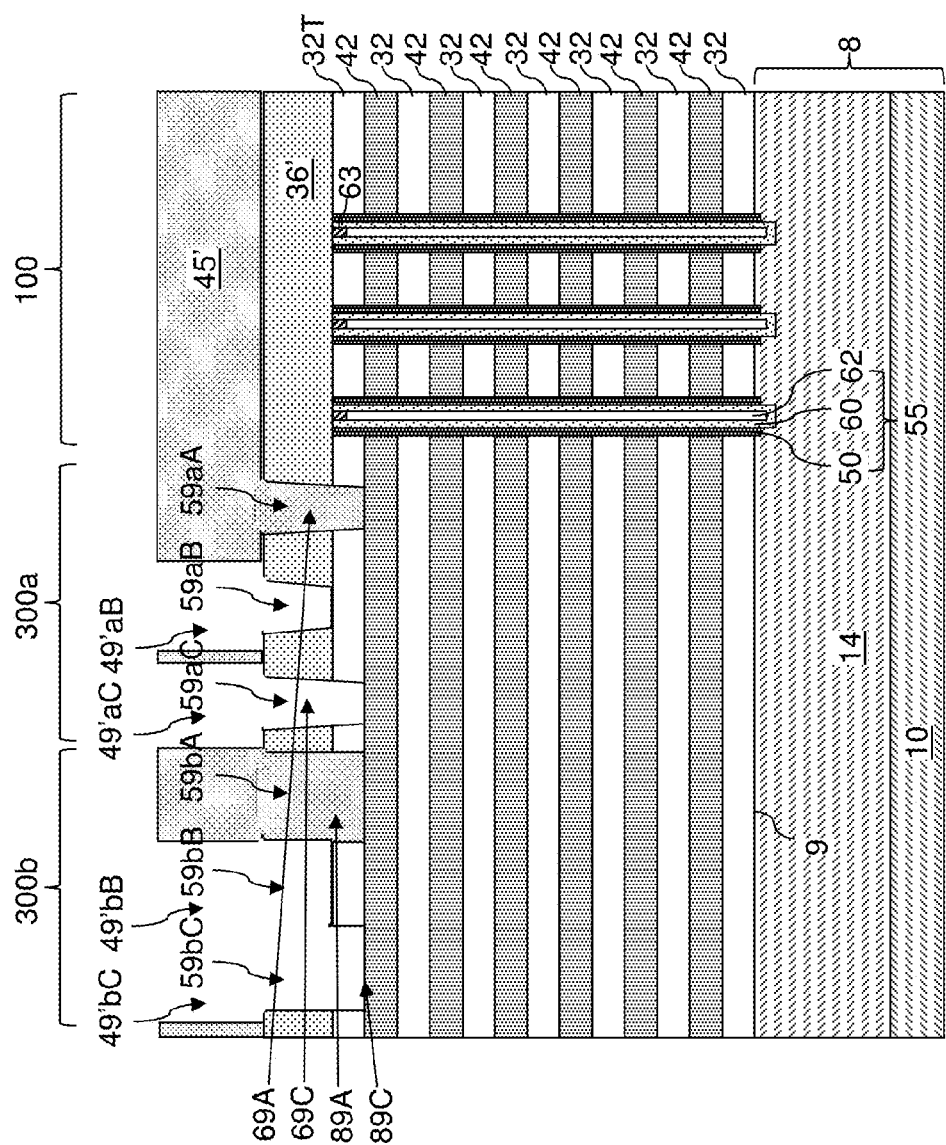

Referring to FIG. 22, a second over mask 45' is formed over the compound contact mask 36'.

Similar to the first over mask 45, the second over mask 45' can be patterned with a plurality of second over mask openings 49' to physically expose a second subset of the contact mask openings 59a and terrace mask openings 59b that is different from the first subset exposed by the first over mask 45, though corresponding or paired contact mask opening and terrace mask opening are included or excluded together in any subset. In the embodiment shown in FIG. 22, second over mask openings 49'aB and 49'aC are substantially aligned with and expose contact mask openings 59aB and 59aC, while second over mask openings 49'bB and 49'bC are substantially aligned with and expose terrace mask openings 59bB and 59bC. Contact mask opening 59aA and terrace mask opening 59bA are covered by a remaining portion of the second over mask 45'.

Figure 23:
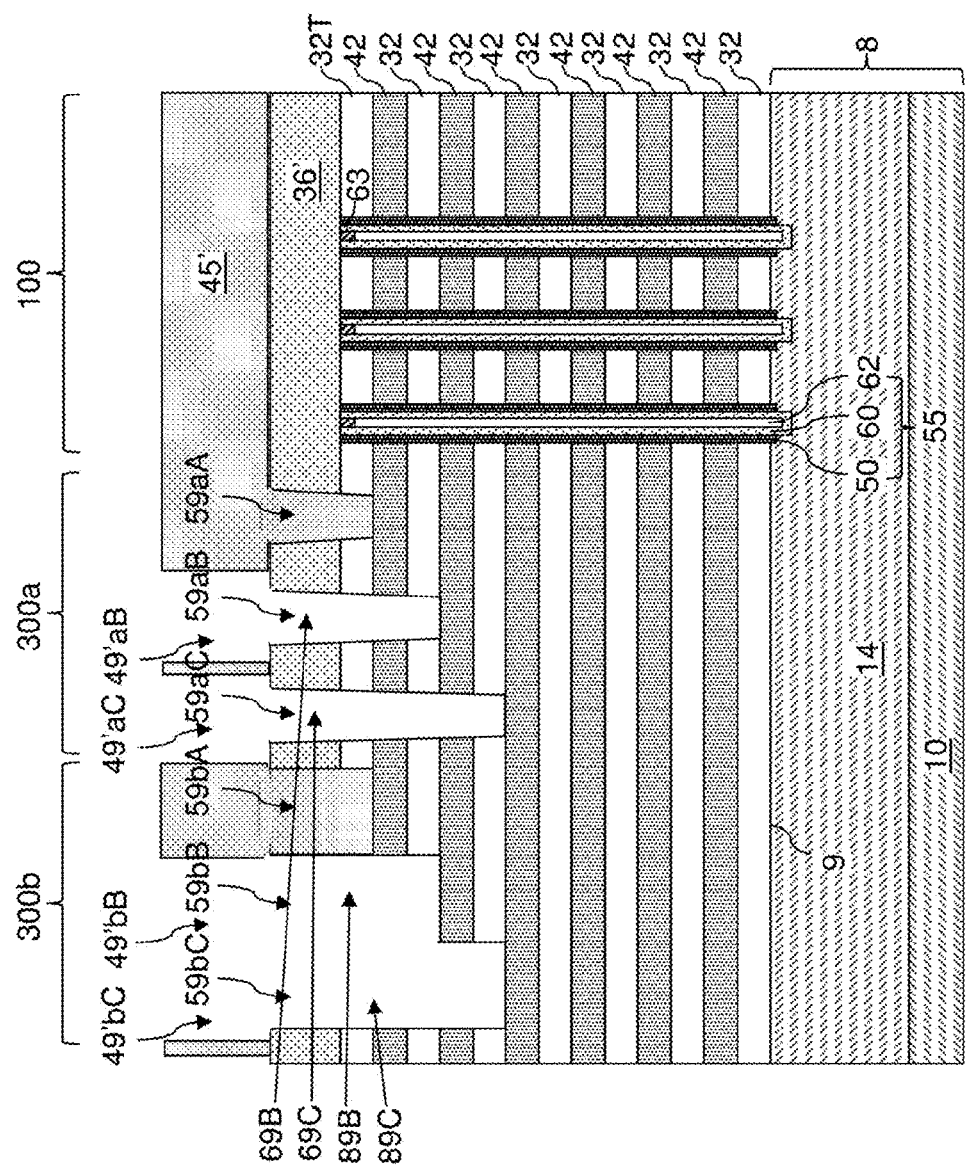

A portion of the stack (32,42) underlying the contact mask openings 59aB and 59aC, and terrace mask openings 59bB and 59bC is anisotropically etched employing the combination of the compound contact mask 36' and the second over mask 45'. As shown in FIG. 23, an anisotropic etch process is performed to vertically extend the contact opening 69C and terrace opening 89C downward through two pairs of the sacrificial layer 42 and the insulator layer 32. Contact opening 69B and corresponding terrace opening 89B are etched through the topmost insulator layer 32T and a pair of the sacrificial layer 42 and the insulator layer 32, to form a part of the terrace structure (i.e., stepped end parts of the sacrificial layers 42) in the terrace region 300b but not in the contact opening region 300a.

In some embodiments, the etch process through more than one sacrificial layer 42 and/or insulator layer 32 is controlled by detecting the presence of material from the sacrificial layer 42 and/or insulator layer 32. The detecting may be performed using a terrace opening 89 being etched. In one embodiment, an etch process to etch a terrace opening 89 and a corresponding contact opening 69 through a topmost insulator layer 32T and a pair of a sacrificial layer 42 and a insulator layer 32 is controlled by stopping the etch process after detecting material from the topmost insulator layer 32T, material from the sacrificial layer 42, and material from the next insulator layer 32. A pattern of detected material from the layer being etched during the etch process can determine which of the plurality of layers in the stack (32,42) is currently being etched. Thus, the etch process can be a general anisotropic etch, and does not need to be an etch that is selective for either material of the insulator layer 32 or material of the sacrificial layer 42.

Figure 24:
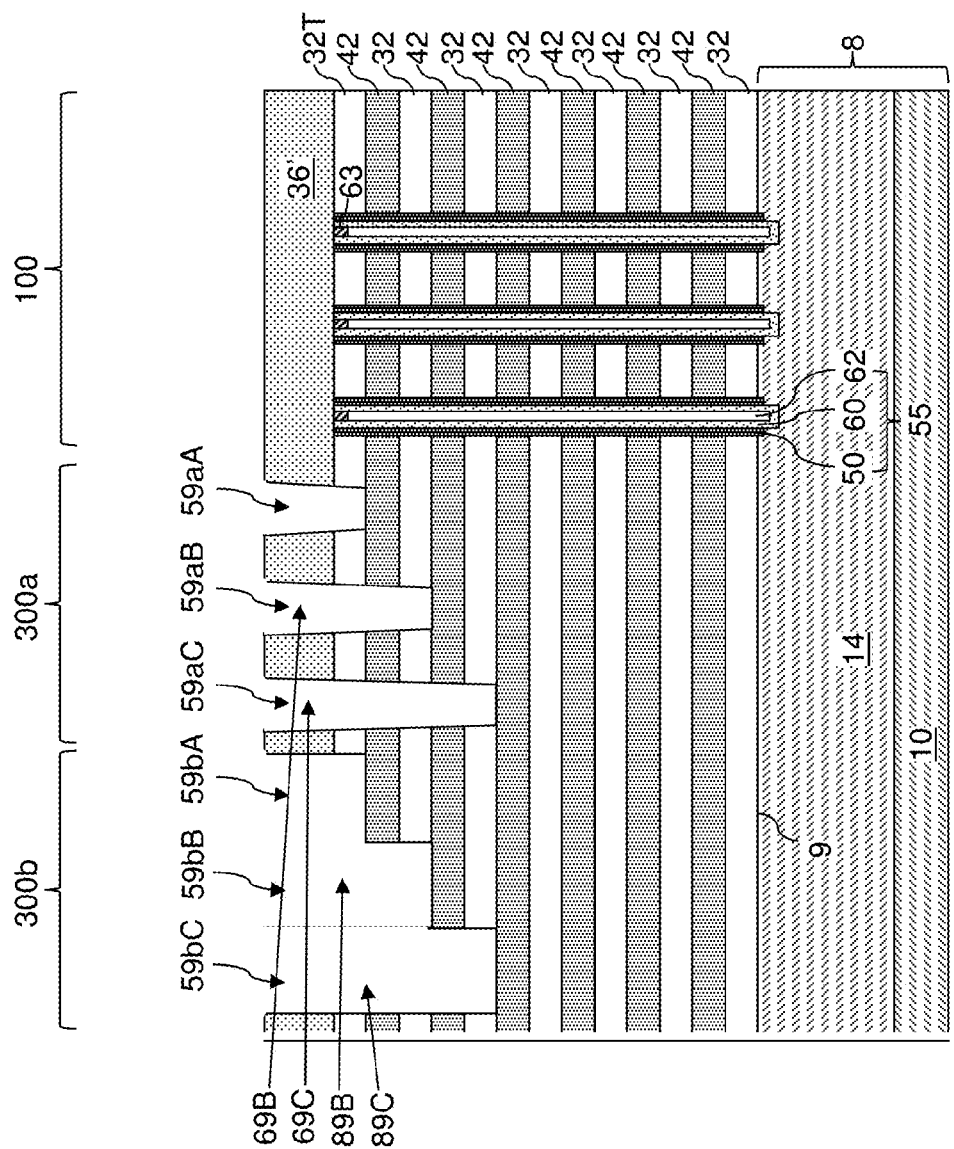

As shown in FIG. 24, the second over mask 45' is then removed to expose part of the terrace structure in region 300b.

Figure 25:
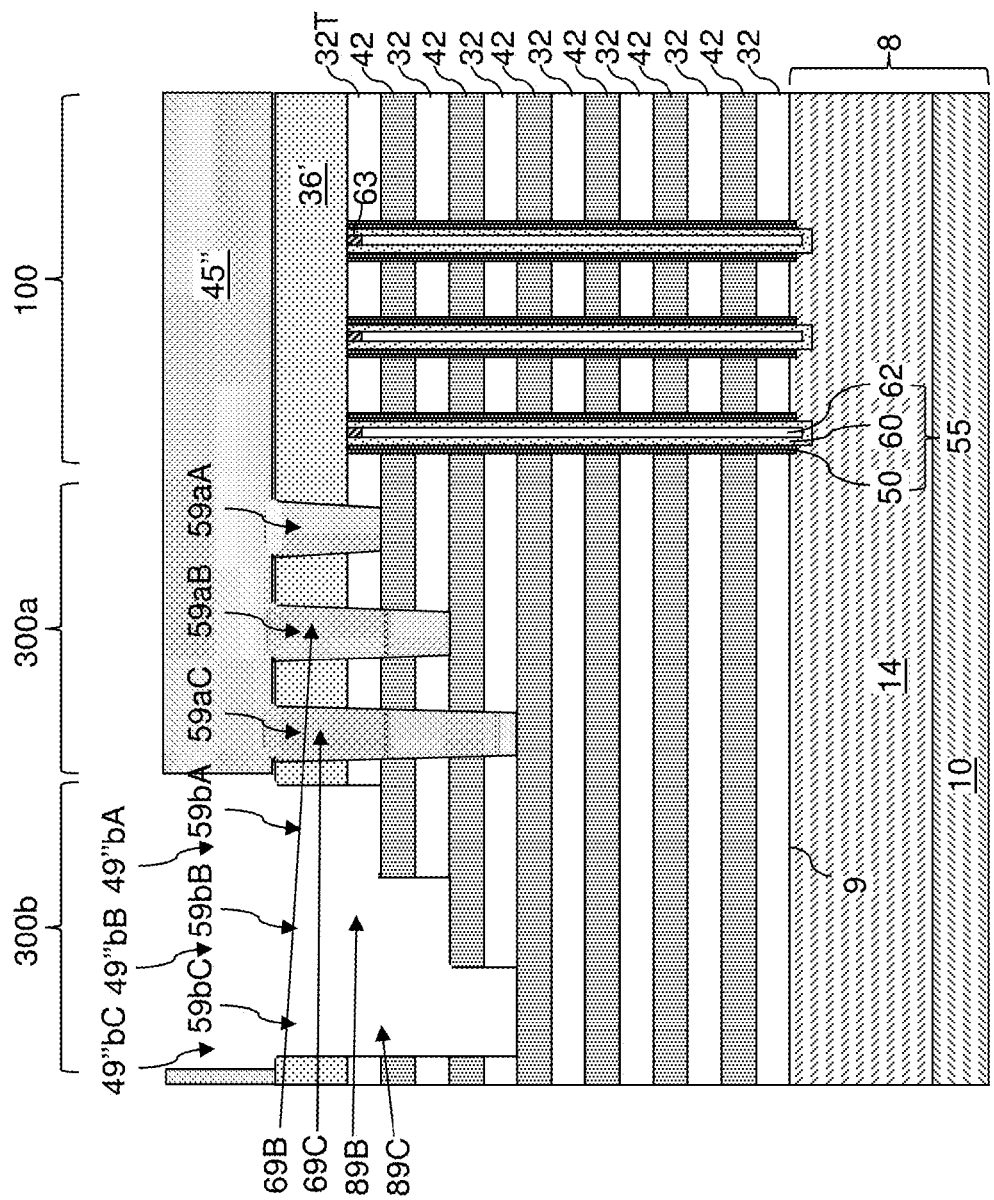

Referring to FIG. 25, a third over mask 45" is formed over the compound contact mask 36'.

The third over mask 45" can be patterned with a plurality of third over mask openings 49" to physically expose all of the terrace mask openings 59b and none of the contact mask openings 59a. In the embodiment shown in FIG. 25, third over mask openings 49"bA, 49"bB, and 49"bC are substantially aligned with and expose terrace mask openings 59bA, 59bB, and 59bC (e.g., the entire terrace mask open area). Contact mask opening 59aA, 59aB, and 59aC are covered by a remaining portion of the third over mask 45".

Figure 26:
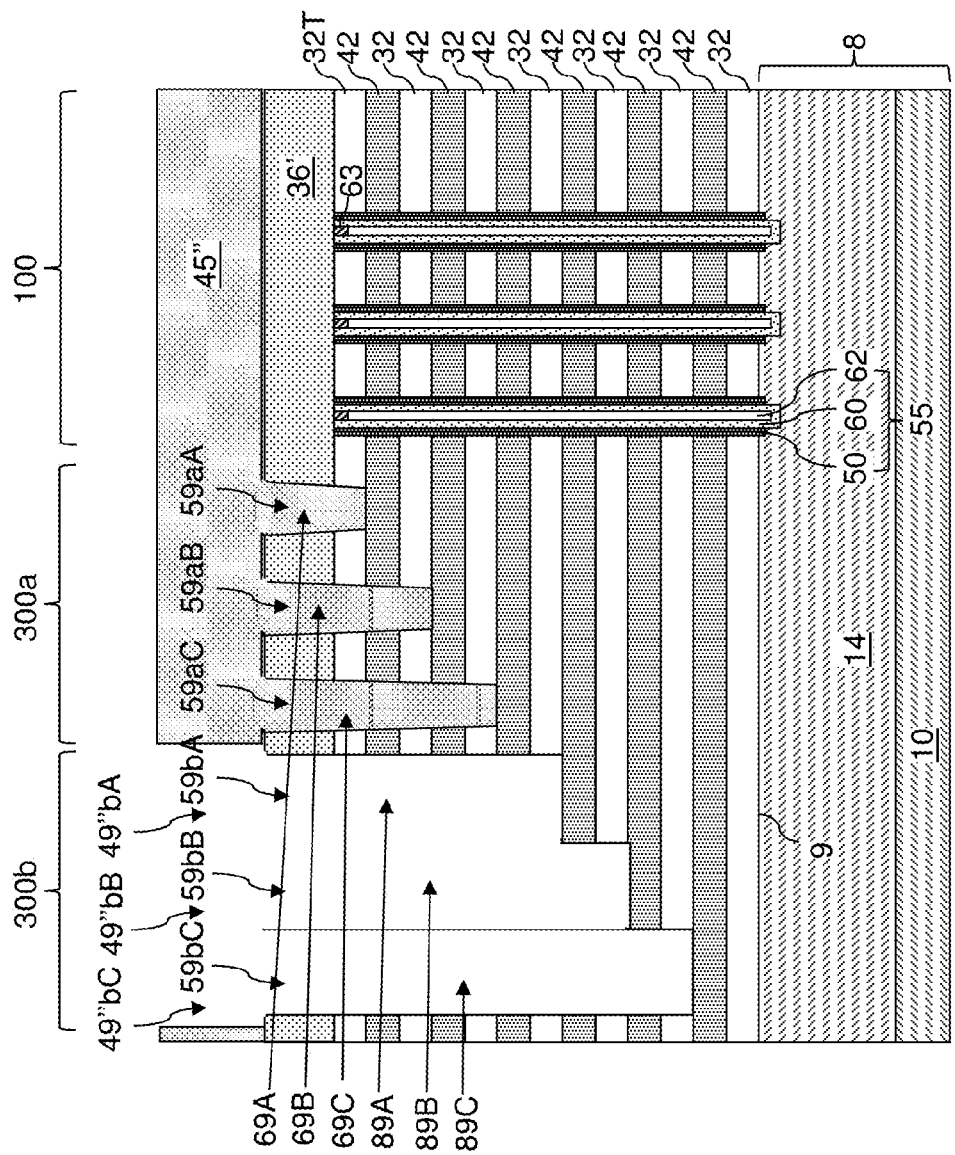

A portion of the stack (32,42) underlying the terrace mask openings 59bA, 59bB, and 59bC is anisotropically etched employing the combination of the compound contact mask 36' and the third over mask 45". As shown in FIG. 26, an anisotropic etch process is performed to vertically extend each of the terrace openings 89A, 89B, and 89C downward through three pairs of the sacrificial layer 42 and the insulator layer 32.

Figure 27:
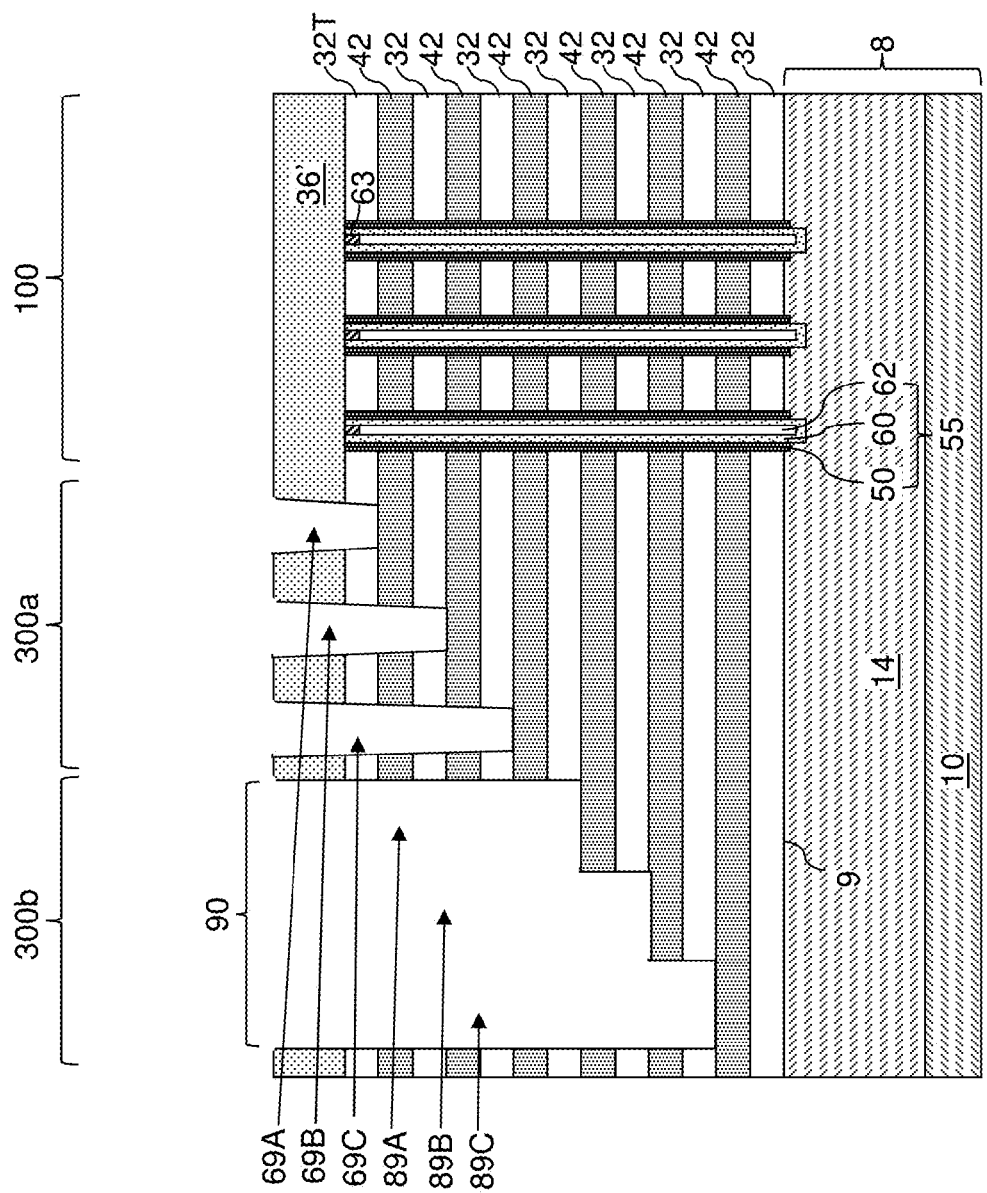

As shown in FIG. 27, the third over mask 45" is then removed. The terrace structure in region 300b includes exposed steps in the sacrificial layers such that each underlying sacrificial layer extends horizontally (i.e., parallel to the major surface 9 of the substrate) into the terrace opening (s) further than the respective overlying sacrificial layers above it. Each terrace opening 89 extends deeper into the stack than each contact opening 69. In other words, each exposed step in the sacrificial layer is located closer to the major surface of the substrate 8 than a respective sacrificial layer exposed at the bottom of each contact opening 69. The exposed portions of the sacrificial layers 42 in the terrace opening(s) 89 together form a terrace structure 90 in the second region 300b As described above with reference to FIGS. 11 and 12, an insulating liner 64 is formed in the contact openings 69. The terrace opening(s) 89 may be masked during this step.

An insulating fill layer 84 is then formed in the terrace opening(s) 89. In some embodiments, the insulating fill layer 84 is thicker than the insulating liner 64, such the insulating fill layer 84 fills the entire terrace opening(s) 89 in region 300b. The insulating fill layer 84 may be formed by depositing an insulating material within the entire terrace opening 89 over the terrace structure 90 followed a planarization (e.g., CMP). A plurality of contact openings may then be formed in layer 84 using another mask (e.g., a photoresist mask) and a selective anisotropic etch through the insulating fill material which stops on the respective sacrificial material step. In these embodiments, the respective sacrificial layers 42 will act as an etch stop for the selective anisotropic etch.

The plantation of the insulating fill layer 84 may lead to dishing. In some embodiments, dishing of the layer 84 is lower due to the smaller area of the layer 84 due to the smaller area devoted to the terrace opening 89 over the terrace structure 90 in the region 300b due to the presence of the contact openings 69, compared to devices including only a terrace structure (but no contact opening) in the contact region.

Figure 28:
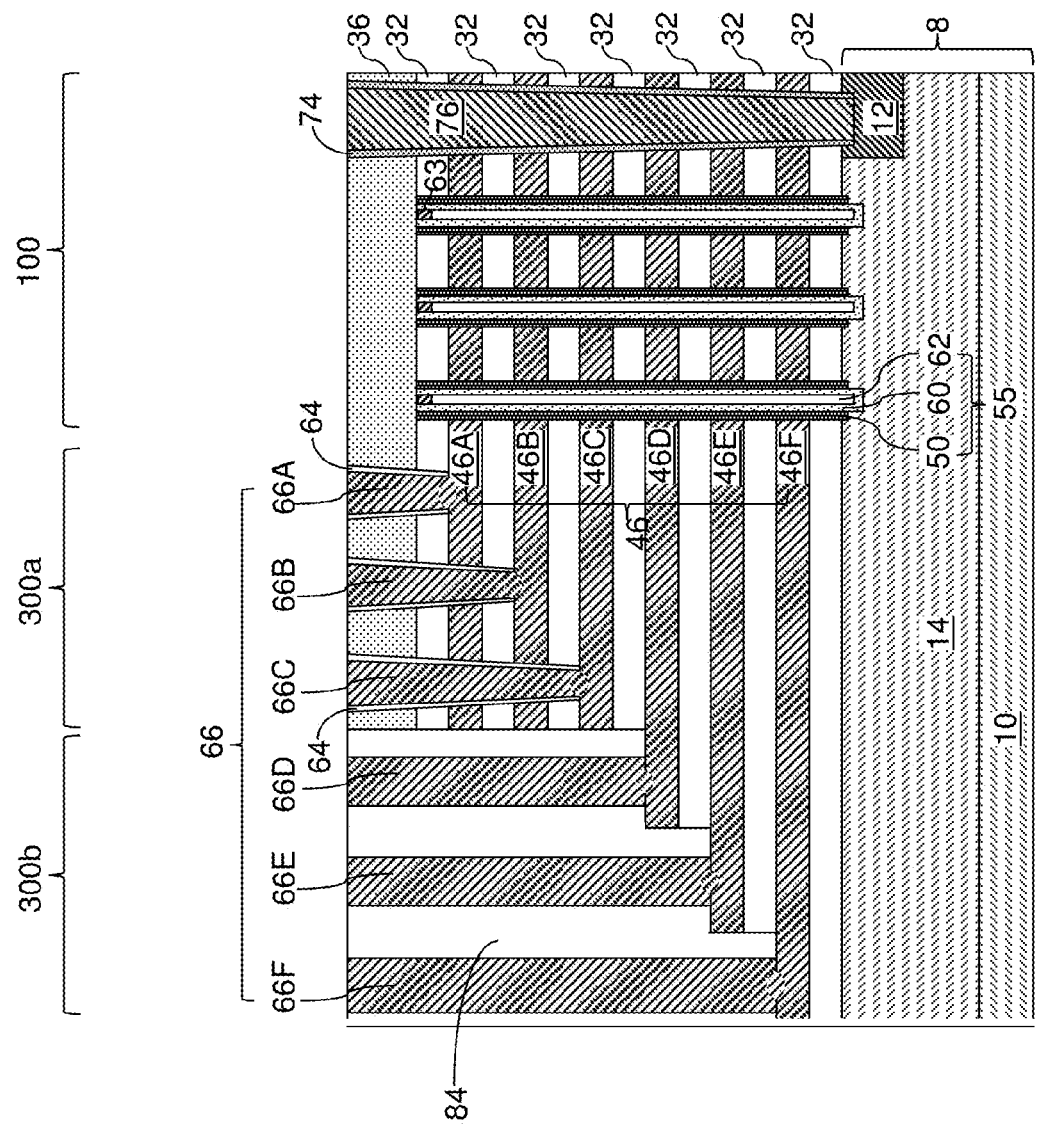

The device shown in FIG. 28 may then be formed using steps as shown in FIGS. 13-17, to replace the sacrificial layers with the control gate electrodes and to form a source contact to the source region in or over the substrate.

In another aspect of the second embodiment of the disclosure, a compound contact mask having a contact mask opening and a terrace mask opening is used to simultaneously form a contact opening and a terrace opening. In some embodiments, a series of compound contact masks is used to etch a plurality of paired contact openings and terrace openings, without using additional over masks.

Figure 29:
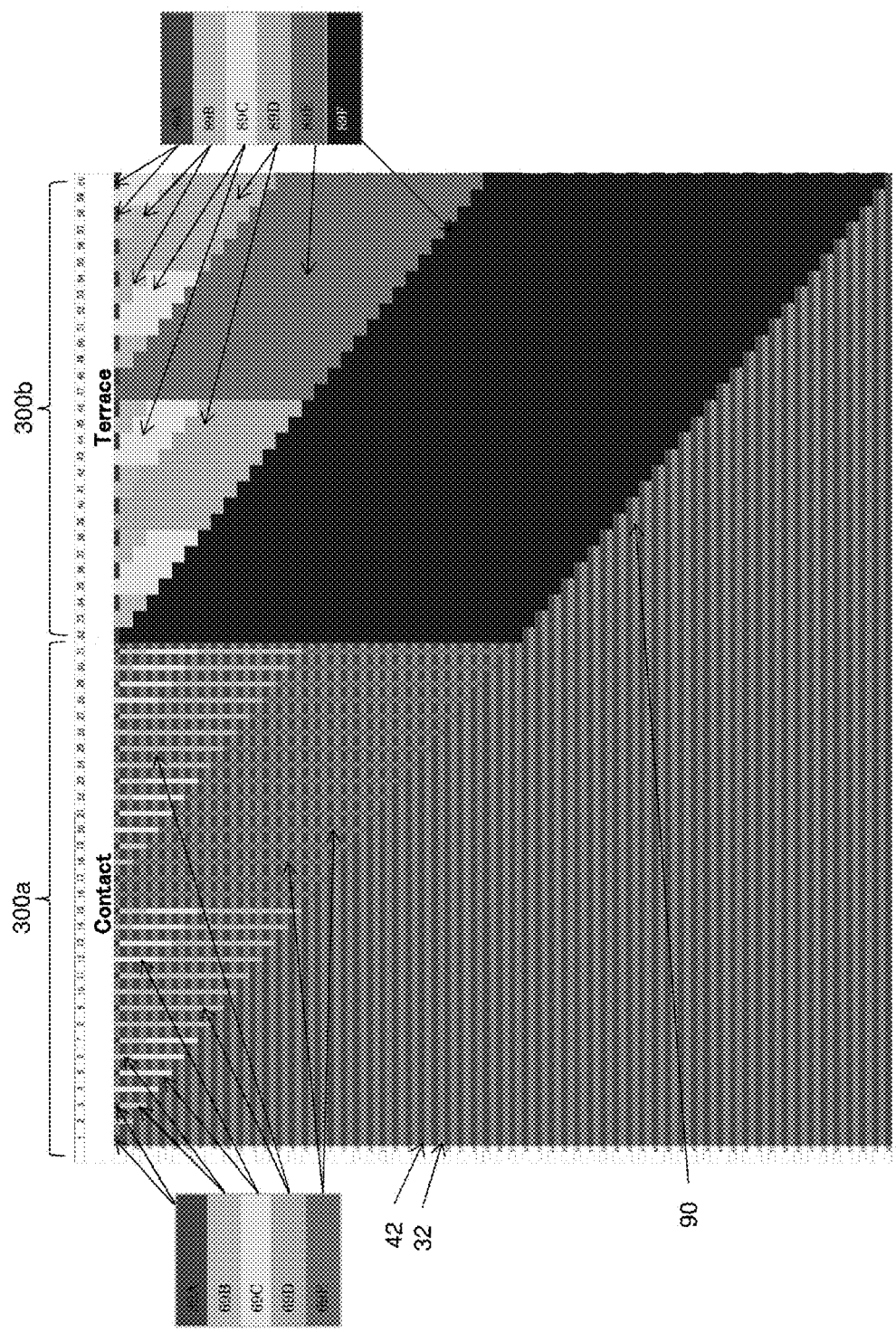
FIG. 29 shows a cross-sectional schematic view of an exponentially increasing binary etching process according to another aspect of the second embodiment of the present disclosure.

As shown in FIG. 29, a binary etching process is used to etch blocks of paired contact openings and terrace openings. In FIG. 29, the exemplary stack contains sixty device levels (e.g., 60 sacrificial layers 42), as shown by the numbers on the vertical axis. The method includes forming contact openings 69 and terrace openings 89 in sixty horizontally spaced apart regions or positions, as shown by the numbers on the horizontal axis. More or less levels and positions may be used.

Similar to the step shown in FIG. 20, a first compound contact mask (e.g., photoresist and/or hard mask) is formed over the stack having first contact mask openings in the odd positions (e.g., 16 openings in positions 1, 3, 5, . . . 31) and first terrace mask openings in even positions starting with position number 32 (e.g., 15 openings in positions 32, 34, 36 . . . 60). The stack is then etched one level through the first openings to form sixteen first contact openings 69A in the odd positions (e.g., positions 1, 3, 5, . . . 31) and fifteen first terrace openings in even positions starting with position number 32 (e.g., 15 openings in positions 32, 34, 36 . . . 60). Thus, the first openings 69A and 89A extend to the upper most sacrificial layer 42 in the stack. Odd and even positions may be reversed. The first compound contact mask is then removed.

Similar to the step shown in FIG. 23, a second compound contact mask (e.g., photoresist and/or hard mask) is formed over the stack having second contact mask openings and second terrace mask openings in every two adjacent positions while skipping two subsequent adjacent positions starting with position number 2 (e.g., positions 2, 3, 6, 7, 10, 11, . . . 30, 31, 33, 34, . . . 56, 57) is formed over the stack. The stack is then etched two levels through the second openings to form sixteen second contact openings 69B in position numbers 2, 3, 6, 7, 10, 11, . . . 30, 31, and fourteen second terrace openings 89B in position numbers 33, 34, . . . 56, 57. Thus, the second openings 69B and 89B which are in a different position (e.g., position numbers 2, 6, 33, 37, etc.) from the respective first openings 69A, 89B extend to the second from the top sacrificial layer 42 in the stack (i.e., level 2). The second openings 69B and 89B which are in the same position (e.g., position numbers 3, 7, 32, 33, etc.) as the respective first openings 69A, 89B extend to the third from the top sacrificial layer 42 in the stack (i.e., level 3). The second compound contact mask is then removed.

Similar to the step shown in FIG. 23, a third compound contact mask (e.g., photoresist and/or hard mask) is formed over the stack having third contact mask openings and third terrace mask openings in every four adjacent positions while skipping four subsequent positions starting with position number 4 (e.g., positions 4-7, 12-15, . . . 35-38, 43-46 etc.) is formed over the stack. The stack is then etched four levels through the third openings to form sixteen third contact openings 69C in position numbers 4-7, 12-15, 20-23 and 28-31, and fourteen third terrace openings 89C in position numbers 35-38, 43-46, 51-54 and 59-60. Thus, the third openings 69C and 89C which are in a different position (e.g., position numbers 4, 12, 35, etc.) from the respective first openings 69A, 89A and second openings 69B, 89B extend to the fourth from the top sacrificial layer 42 in the stack (i.e., level 4). The third openings 69C and 89C which are in the same position (e.g., position numbers 5, 13, 36, etc.) as the respective first openings 69A, 89A extend to the fifth from the top sacrificial layer 42 in the stack (i.e., level 5). The third openings 69C and 89C which are in the same position (e.g., position numbers 6, 14, 37, etc.) as the respective second openings 69B, 89B extend to the sixth from the top sacrificial layer 42 in the stack (i.e., level 6). The third openings 69C and 89C which are in the same position (e.g., position numbers 7, 15, 38, etc.) as the both respective first and second openings extend to the seventh from the top sacrificial layer 42 in the stack (i.e., level 7).

The process described above is may be repeated as many times as needed to form openings extending to each device level. For example, as shown in FIG. 29, the process is repeated two more times, where the depth of etching (i.e., number of levels etched) and the number of consecutive adjacent opening positions and skipped adjacent positions increases exponentially. First, the stack is etched eight levels through the fourth mask openings to form sixteen fourth contact openings 69D in position numbers 8-15 and 24-30, and fourteen fourth terrace openings 89D in position numbers 39-46 and 55-60. Then, the stack is etched sixteen levels through the fifth mask openings to form sixteen fifth contact openings 69E in positions 16-31, and fourteen fifth terrace openings 89E in position numbers 55-60. Since the example shown in FIG. 29 contains sixty device levels and sixty positions for the openings (rather than sixty two), there are two fewer total levels and positions than $2^5$ and only fourteen levels are etched in region 300b. These steps may be repeated with exponentially increasing numbers of levels depending on the number of levels in the stack.

Finally, similar to the steps shown in FIGS. 26-27, the contact opening region 300a is masked, and the terrace region 300b is etched 32 levels to complete the terrace open area 89F and to form the terrace structure 90 having twenty nine exposed steps in the bottom twenty nine sacrificial layers 42 in the stack, as shown in FIG. 29.

Figure 30:
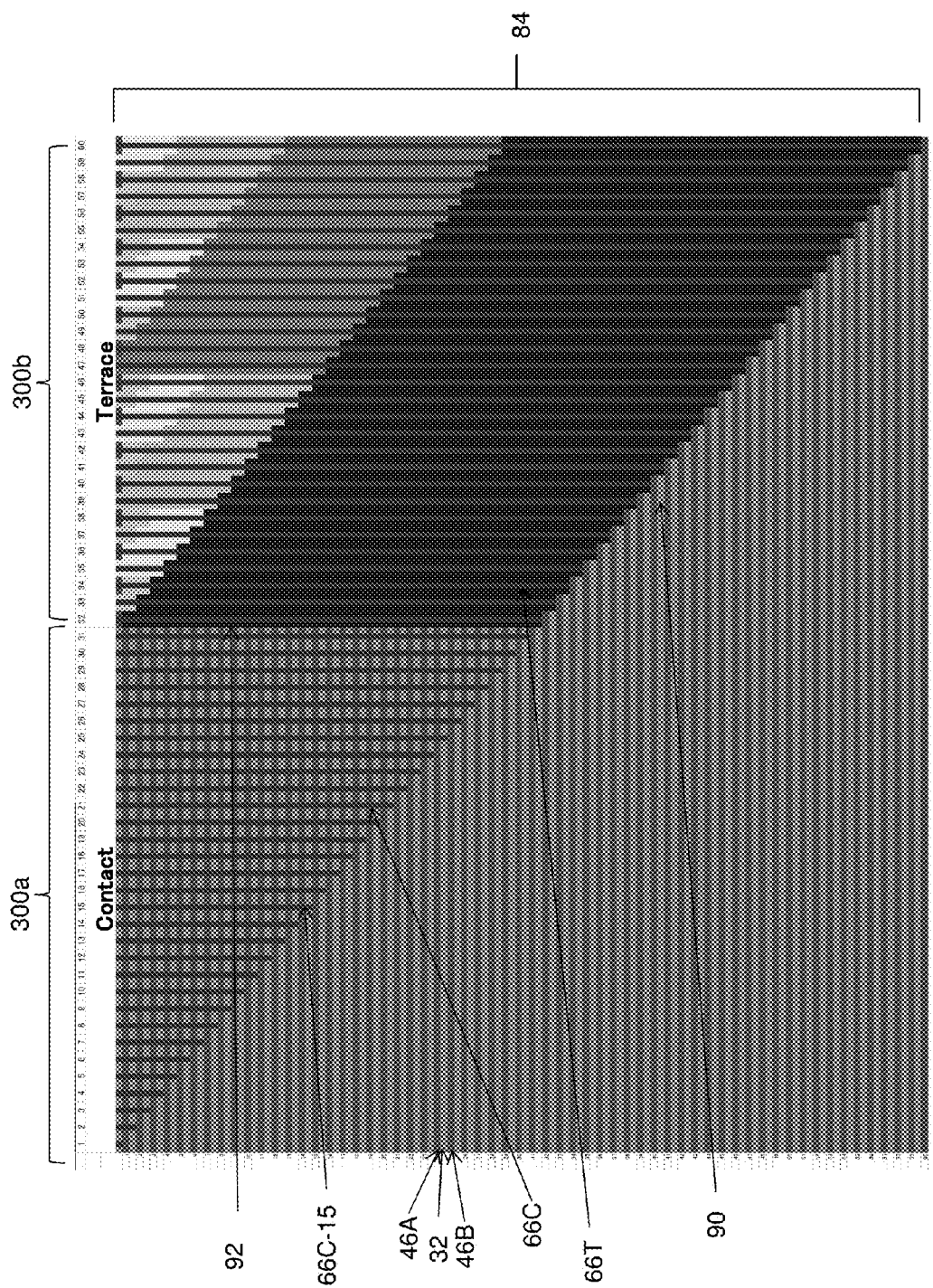
FIG. 30 shows a cross-sectional schematic view of a resulting device.

The device shown in FIG. 30 may then be formed by forming the insulating fill layer 84 in over the terrace structure 90 in region 300b, forming a plurality of contact openings in layer 84 to respective steps of the terrace structure 90, followed by using steps as shown in FIGS. 11-17 (e.g., where region 300b is masked during formation of the liner 64 in contact openings 69 as shown in FIGS.

11-12). These steps form the control gate electrodes 46 and via contacts 66. The via contacts 66 extend through the contact openings 69 in the stack region 300a to the control gate electrodes 46 in the upper thirty one levels. The via contacts 66 extend through the contact openings in the insulating fill layer 84 in region 300b to the steps in control gate electrodes 46 in the terrace structure in the lower twenty nine levels.

The device shown in FIG. 30 includes a stack (32, 46) of plurality of alternating word lines (e.g., control gate electrodes) (46) and insulator (also referred to as insulating) layers (32) located over the major surface of the substrate (e.g., surface 9 of substrate 8 shown in FIG. 28) and extending substantially parallel to the major surface of the substrate. The plurality of word lines 46 comprise at least a first word line 46A located in a first device level 24 and a second word line 46B located in a second device level 25 located over the major surface of the substrate and below the first device level.

The device also includes the semiconductor channel 60 having at least one end portion extending substantially perpendicular to the major surface of the substrate through the stack, and at least one charge storage region in the memory film 50 located adjacent to the semiconductor channel (see FIG. 28).

A first plurality of electrically conductive via contacts 66C in region 300a extend substantially perpendicular to the major surface of the substrate through the stack (32, 46) to contact an upper surface of a respective one of the plurality of word lines 46 in a first set (e.g., in upper levels 1-31) of word lines 46. An insulating liner 64 (shown in FIG. 28 and omitted from FIG. 30 for clarity) is located around each of the first plurality of electrically conductive via contacts 66C in region 300a. The insulating liner 64 isolates each of the first plurality of electrically conductive via contacts 66C from all the word lines 46 in the stack through which each electrically conductive via contact 66C extends, except a respective one of the plurality of word lines whose upper surface is contacted by the respective electrically conductive via contact. For example, via contact 66C-15 contacts the upper surface of the word line 46 in level 15. The insulating liner 64 isolates the via contact 66C-15 from all the word lines 46 in levels 1-14 in the stack through which each electrically conductive via contact 66C-15 extends.

The device also include a terraced region 300b in the stack comprising end portions of a second set of word lines 46 (e.g. word lines in lower levels 32-60) arranged in a stepped configuration 90 in which underlying word lines extend past overlying word lines in a direction parallel to the major surface of the substrate. For example, the word line in level 40 extends past the word line in level 39. The insulating fill layer 84 is located above the terraced region in the stack. A second plurality of electrically conductive via contacts 66T extend substantially perpendicular to the major surface of the substrate through the insulating fill layer 84 to contact an upper surface of a respective one of the second set of word lines 46.

The first set of word lines 46 in region 300a (e.g., in levels 1-31) lacks the stepped configuration 90, such that end (i.e., bottom) portions of the first set of word lines terminate in a same vertical plane 92 adjacent to the terraced region 300b (e.g., the plane 92 which separates regions 300a and 300b). The first set of word lines in region 300a is located above the second set of word lines in region 300b.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of making multi-level contacts, comprising:
providing an in-process multilevel device comprising a device region and a contact region comprising a stack of plurality of alternating sacrificial layers and insulating layers located over a major surface of a substrate;
providing a contact mask with a plurality of contact mask openings over the stack;
providing a first over mask with a plurality of first over mask openings over the contact mask, wherein a first subset of the plurality of contact mask openings is substantially aligned with the plurality of first over mask openings;
forming a plurality of contact openings, wherein each of the plurality of contact openings extends substantially perpendicular to the major surface of the substrate through the stack to a respective one of the sacrificial layers;
depositing a plurality of electrically conductive via contacts in the plurality of the contact openings;
forming an insulating liner on a sidewall of each of the plurality of contact openings prior to depositing the plurality of electrically conductive via contacts;
forming a trench through the stack;
selectively removing the sacrificial layers from the stack through the plurality of contact openings and through the trench to form a plurality of recesses, wherein the plurality of recesses comprise a first recess in the first device level located over the major surface of the substrate and a second recess in the second device level located lower than the first device level over the major surface of the substrate; and
depositing a plurality of electrically conductive electrodes in the plurality of recesses through the trench;
wherein:
the sacrificial layers comprise at least a first sacrificial layer in a first device level located over the major surface of the substrate and a second sacrificial layer in a second device level located lower than the first device level over the major surface of the substrate;
a second contact opening extends to an upper surface of the second sacrificial layer;
a first contact opening extends to an upper surface of the first sacrificial layer;
the first sacrificial layer extends around the second contact opening;
a first electrically conductive electrode of the plurality of electrically conductive electrodes is deposited in the first recess and extends around a second contact opening of the plurality of contact openings;
a second electrically conductive via contact of the plurality of electrically conductive via contacts is located in the second contact opening;
an insulating liner on a sidewall of the second contact opening electrically isolates the first electrically conductive electrode deposited in the first recess from the second electrically conductive via contact located in the second contact opening; and the second electrically conductive via contact extends deeper into the stack than a first electrically conductive via contact in a first contact opening such that bottom surfaces of the plurality of electrically conductive via contacts form a step pattern.

2. The method of claim 1, wherein the contact mask comprises a hard mask.

3. The method of claim 2, wherein the first over mask comprises a photoresist layer.

4. The method of claim 1, wherein each of the plurality of first over mask openings is larger than each of the plurality of contact mask openings.

5. The method of claim 1, wherein the step of forming a plurality of contact openings comprises:
etching a portion of the stack through the first subset of the plurality of contact mask openings and through the first over mask openings;
removing the first over mask;
providing a second over mask with a plurality of second over mask openings over the contact mask, wherein a second subset of the plurality of contact mask openings is substantially aligned with the plurality of second over mask openings; and
etching a portion of the stack through the second subset of the plurality of contact mask openings and through the second over mask openings.

6. The method of claim 5, wherein:
the contact mask comprises a hard mask;
the first over mask and the second over mask each comprise a photoresist layer; and
each of the plurality of first over mask openings and each of the plurality of second over mask openings is larger than each of the plurality of contact mask openings.

7. The method of claim 5, wherein the step of forming a plurality of contact openings further comprises:
removing the second over mask;
providing a third over mask with a plurality of third over mask openings over the contact mask, wherein a third subset of the plurality of contact mask openings is substantially aligned with the plurality of third over mask openings; and
etching a portion of the stack through the third subset of the plurality of contact mask openings and through the third over mask openings.

8. The method of claim 5, wherein at least one contact mask opening of the first subset of the plurality of contact mask openings is the same as at least one contact mask opening of the second subset of the plurality contact mask openings.

9. The method of claim 8, wherein:
the step of etching a portion of the stack through the second subset of the plurality of contact mask openings comprises extending at least one contact opening created in the step of etching a portion of the stack through the first subset of the plurality of contact mask openings, and
the at least one contact opening corresponds to the at least one contact mask opening of the first subset of the plurality of contact mask openings that is the same as at least one contact mask opening of the second subset of the plurality contact mask openings.

10. The method of claim 1, wherein forming the insulating liner comprises depositing an insulating material on the sidewall and bottom surface of each of the plurality of contact openings and removing the insulating material from the bottom surface of each of the plurality of contact openings.

11. The method of claim 1, wherein depositing the plurality of electrically conductive via contacts comprises depositing a first electrically conductive via contact in the first contact opening and depositing a second electrically conductive via contact in the second contact opening in a same deposition step.

12. The method of claim 1, further comprising removing an electrically conductive electrode material of the plurality of electrically conductive electrodes from the trench, forming an insulating layer on a sidewall of the trench, and forming a source line in the trench such that the source line electrically contacts a portion of the device region of the device.

13. The method of claim 1, wherein:
forming the plurality of contact openings comprises forming a linear set of first contact openings that extend to the first device level, and forming a linear set of second contact openings that extend to the second device level; and
depositing the plurality of electrically conductive via contacts comprises depositing a plurality of first electrically conductive via contacts in the set of first contact openings and depositing a plurality of second electrically conductive via contacts in the set of second contact openings.

14. The method of claim 1, wherein the plurality of electrically conductive electrodes comprise a plurality of word lines.

15. The method of claim 14, wherein the device comprises a vertical NAND device comprising:
a plurality of semiconductor channels, wherein at least one end portion of each of the plurality of semiconductor channels extends substantially perpendicular to the major surface of the substrate in the device region;
a plurality of charge storage regions, each charge storage region located adjacent to a respective one of the plurality of semiconductor channels; and
a plurality of control gate electrodes extending substantially parallel to the major surface of the substrate, wherein the plurality of control gate electrodes comprise at least a first control gate electrode located in the first device level and a second control gate electrode located in the second device level;
the first control gate electrode comprises an end portion of a first word line of the plurality of word lines;
the second control gate electrode comprises an end portion of a second word line of the plurality of word lines; and
the first and the second word lines extend from the device region to the contact region.

16. The method of claim 1, wherein:
the sacrificial layers comprise silicon nitride layers;
the insulating layers comprise silicon oxide layers; and
selectively removing the sacrificial layers comprises selectively etching the silicon nitride layers using a phosphoric acid wet etching step.

17. The method of claim 16, wherein the plurality of word lines comprise tungsten or titanium nitride and tungsten word lines deposited by chemical vapor deposition.

18. The method of claim 1, further comprising forming a plurality of terrace openings extending substantially perpendicular to the major surface of the substrate through the stack to a respective one of the sacrificial layers, wherein:

the contact mask further comprises a plurality of first terrace mask openings;

the first over mask further comprises a plurality of second terrace mask openings;

each of the plurality of second terrace mask openings is larger than each of the plurality of first terrace mask openings;

each of the plurality of first terrace mask openings is larger than each of the plurality of contact mask openings;

a first subset of the plurality of first terrace mask openings is substantially aligned with the plurality of second terrace mask openings;

the plurality of terrace openings is formed by etching a portion of the stack through the first subset of the plurality of first terrace mask openings; and at least one contact opening of the plurality of contact openings and at least one terrace opening of the plurality of terrace openings extend to a common sacrificial layer.

19. The method of claim 18, further comprising:

forming an insulating liner on a sidewall of each of the plurality of contact openings prior to depositing the plurality of electrically conductive via contacts;

forming an insulating layer in the plurality of terrace openings;

forming a plurality of terrace contact openings in the insulating layer which stop on respective terrace steps; and depositing a plurality of electrically conductive terrace via contacts in the plurality of the terrace contact openings.

\* \* \* \* \*